United States Patent
Ha et al.

(12)

(10) Patent No.: US 11,733,601 B2
(45) Date of Patent: Aug. 22, 2023

(54) EUV PHOTOMASK AND METHOD OF FORMING MASK PATTERN USING THE SAME

(71) Applicant: Samsung Electronics Co., Ltd., Suwon-si (KR)

(72) Inventors: Soonmok Ha, Seongnam-si (KR); Jaehee Kim, Yongin-si (KR); Sangho Yun, Yongin-si (KR); Chan Hwang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 283 days.

(21) Appl. No.: 17/308,484

(22) Filed: May 5, 2021

(65) Prior Publication Data
US 2022/0082926 A1    Mar. 17, 2022

(30) Foreign Application Priority Data
Sep. 15, 2020    (KR) ......................... 10-2020-0118362

(51) Int. Cl.
*G03F 1/24*    (2012.01)
(52) U.S. Cl.
CPC ...................................... *G03F 1/24* (2013.01)
(58) Field of Classification Search
CPC ........................................................ G03F 1/24
USPC ............................................................ 430/5
See application file for complete search history.

(56) References Cited

U.S. PATENT DOCUMENTS

| | | |
|---|---|---|
| 8,563,201 B2 | 10/2013 | Hu et al. |
| 10,007,191 B2 | 6/2018 | Biafore et al. |
| 10,331,043 B2 | 6/2019 | Van Buel et al. |
| 10,379,445 B2 | 8/2019 | Jak et al. |
| 10,394,137 B2 | 8/2019 | Van Dommelen et al. |
| 2008/0182415 A1 | 7/2008 | Hong et al. |
| 2010/0296074 A1 | 11/2010 | Morita et al. |
| 2013/0189608 A1 | 7/2013 | Oh et al. |
| 2020/0066648 A1 | 2/2020 | Chen et al. |
| 2020/0089100 A1 | 3/2020 | Ha et al. |

OTHER PUBLICATIONS

Extended European Search Report dated Feb. 17, 2022 issued in corresponding European Appln. No. 21195623.0.

*Primary Examiner* — Christopher G Young
(74) *Attorney, Agent, or Firm* — Harness, Dickey & Pierce, P.L.C.

(57) ABSTRACT

An EUV photomask having a main area and a scribe lane area and reflecting EUV light includes a reflective multilayer film and an absorption pattern, wherein the scribe lane area includes first and second lanes, wherein the first lane includes first and second sub-lanes extending in the same direction as an extending direction of the first lane, wherein the first sub-lane includes a first dummy pattern that is a portion of the absorption pattern, and the second sub-lane includes a second dummy pattern that is a portion of the absorption pattern, and when EUV light that is not absorbed by the first and second dummy patterns and is reflected by the reflective multilayer film is irradiated at least twice by overlapping a negative tone photoresist, an amount of light exceeds a threshold dose of light in the negative tone photoresist corresponding to the first lane.

20 Claims, 22 Drawing Sheets

Comparative Example

Comparative Example

Comparative Example

Comparative Example

Comparative Example

Comparative Example

Comparative Example

EUV PHOTOMASK AND METHOD OF FORMING MASK PATTERN USING THE SAME

CROSS-REFERENCE TO RELATED APPLICATION

This application is based on and claims priority under 35 U.S.C. § 119 to Korean Patent Application No. 10-2020-0118362, filed on Sep. 15, 2020, in the Korean Intellectual Property Office, the disclosure of which is incorporated by reference herein in its entirety.

BACKGROUND

The inventive concepts relate to an extreme ultraviolet (EUV) photomask and a method of forming a mask pattern using the same, and more particularly, to an EUV photomask that may be designed and manufactured less expensively, quicker, and/or with fewer defects, and a method of forming a mask pattern on a semiconductor substrate using the same.

In order to implement a semiconductor device on a semiconductor substrate, photolithography technology including exposure and development processes is used. In forming a mask pattern on a semiconductor substrate according to the downscaling tendency of semiconductor devices, EUV light is used as a light source of an exposure apparatus. An EUV photomask used in such an exposure apparatus performs overlapping exposure on a scribe lane, and is configured to reflect EUV light through at least a portion of a portion corresponding to the scribe lane. However, there are example embodiments that the reflected EUV light is unnecessarily scattered and has an undesired effect on a main area, and thus, a method to control this may be advantageous.

SUMMARY

The inventive concepts provide an extreme ultraviolet (EUV) photomask that can be designed and manufactured less expensively, quicker, and/or with fewer defects.

The inventive concepts provide a method of forming a mask pattern on a semiconductor substrate by using an EUV photomask that can be designed and manufactured less expensively, quicker, and/or with fewer defects.

The inventive concepts are not limited to the above objectives, and other objectives not described herein may be clearly understood by those of ordinary skill in the art from descriptions below.

According to an aspect of the inventive concepts, there is provided an extreme ultraviolet (EUV) photomask having a main area and a scribe lane area surrounding the main area and reflecting EUV light, the EUV photomask including a reflective multilayer film and an absorption pattern on the reflective multilayer film, wherein the scribe lane area includes a first lane and a second lane extending from both sides of the main area, respectively, wherein the first lane includes a first sub-lane and a second sub-lane extending in the same direction as the extending direction of the first lane, wherein the first sub-lane includes a first dummy pattern that is a portion of the absorption pattern, and the second sub-lane includes a second dummy pattern that is a portion of the absorption pattern, and when EUV light that is not absorbed by the first and second dummy patterns and is reflected by the reflective multilayer film is irradiated at least twice by overlapping a negative tone photoresist on a semiconductor substrate, an amount of light exceeds a threshold dose of light in the negative tone photoresist corresponding to the first lane.

According to another aspect of the inventive concepts, there is provided an EUV photomask having a rectangular main area and a scribe lane area surrounding the main area and reflecting EUV light, the EUV photomask including a reflective multilayer film and an absorption pattern on the reflective multilayer film, wherein the scribe lane area includes first to fourth lanes extending from an edge of the main area, respectively, wherein the first lane includes first and second sub-lanes, the second lane includes third and fourth sub-lanes, the fourth lane includes fifth and sixth sub-lanes, and the fifth lane includes seventh and eighth sub-lanes, and further includes first to eighth dummy patterns corresponding to the first to eighth sub-lanes, respectively and being a portion of the absorption pattern, and when EUV light that is not absorbed by the first to eighth dummy patterns and is reflected by the reflective multilayer film is irradiated at least twice by overlapping a negative tone photoresist on a semiconductor substrate, an amount of light exceeds a threshold dose of light in the negative tone photoresist corresponding to the first to fourth lanes.

According to another aspect of the inventive concepts, there is provided a an EUV photomask having a rectangular main area and a scribe lane area surrounding the main area with a certain width and reflecting EUV light, wherein the scribe lane area includes first to fourth corner areas adjacent to four corners of the main area, respectively, and when the reflected EUV light is irradiated once to a negative tone photoresist on a semiconductor substrate through the first to fourth corner areas, an amount of light exceeds a threshold dose of light in the negative tone photoresist.

According to another aspect of the inventive concepts, there is provided a method of forming a mask pattern may include: preparing a semiconductor substrate including a main area and a scribe lane area surrounding the main area; applying a negative tone photoresist on the semiconductor substrate; irradiating EUV light reflected by an EUV photomask by overlapping the negative tone photoresist; and developing the negative tone photoresist to form a mask pattern corresponding to the scribe lane area, wherein the EUV photomask includes a reflective multilayer film and an absorption pattern on the reflective multilayer film, and first to fourth lanes corresponding to the scribe lane area and vertically connected to each other, wherein each of the first to fourth lanes includes inner sub-lanes and outer sub-lanes, and further includes inner dummy patterns arranged on the inner sub-lanes and being a portion of an absorption pattern; and outer dummy patterns arranged on the outer sub-lanes and being a portion of an absorption pattern.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EXAMPLE EMBODIMENTS

Hereinafter, example embodiments of the inventive concepts will be described in detail with reference to the accompanying drawings.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 1A:
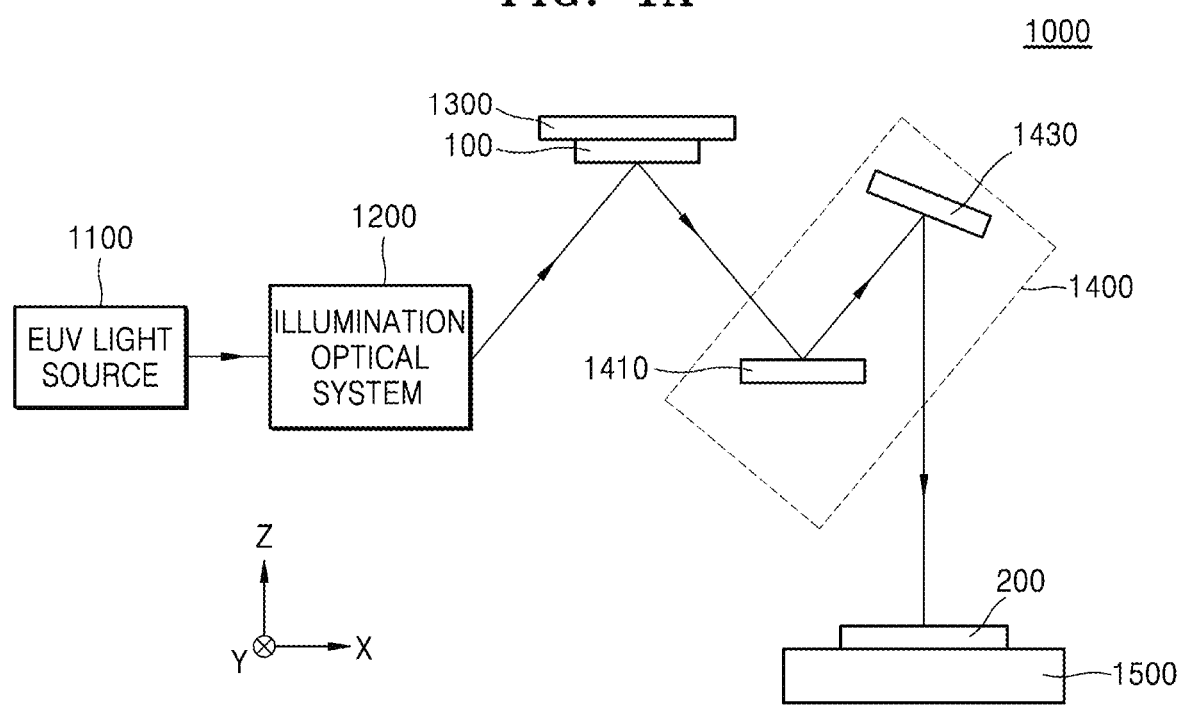
FIGS. 1A and 1B are configuration diagrams of an EUV exposure apparatus according to example embodiments.
Figure 1B:
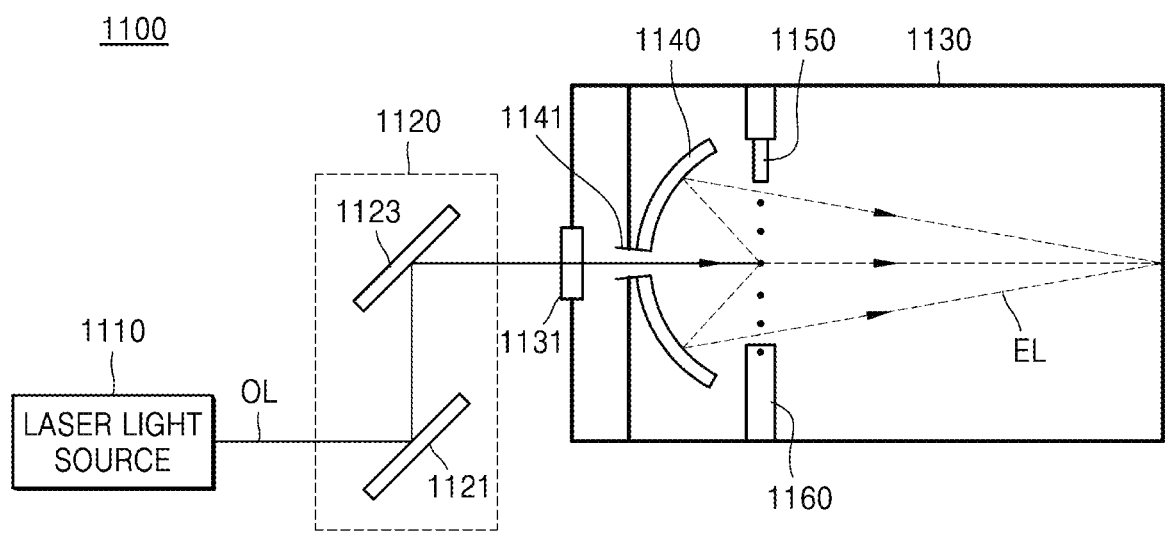

FIGS. 1A and 1B are configuration diagrams of an extreme ultraviolet (EUV) exposure apparatus according to example embodiments.

Referring to FIGS. 1A and 1B together, an EUV exposure apparatus 1000 may include an EUV light source 1100, an illumination optical system 1200, a photomask support 1300, a projection optical system 1400, and/or a substrate stage 1500.

The EUV light source 1100 may generate and output EUV light EL having a higher energy density. For example, the EUV light EL emitted from the EUV light source 1100 may have a wavelength of about 4 nm to about 124 nm. In some example embodiments, the EUV light EL may have a wavelength of about 4 nm to about 20 nm, and the EUV light EL may have a wavelength of 13.5 nm.

The EUV light source 1100 may be a plasma-based light source or a synchrotron radiation light source. The plasma-based light source refers to a light source of a method of generating plasma and using light emitted by the plasma, and may be a laser beam-produced plasma light source, a discharge-produced plasma light source, etc.

The EUV light source 1100 may include a laser light source 1110, a transmission optical system 1120, a vacuum chamber 1130, a collector mirror 1140, a droplet generator 1150, and/or a droplet catcher 1160.

The laser light source 1110 may be configured to output a laser beam OL. For example, the laser light source 1110 may output a carbon dioxide laser beam. The laser beam OL output from the laser light source 1110 may be incident on a window 1131 of the vacuum chamber 1130 through a plurality of reflecting mirrors 1121 and 1123 included in the transmission optical system 1120, and may be introduced into the vacuum chamber 1130.

An aperture 1141 through which the laser beam OL may pass may be formed in the center of the collector mirror 1140, and the laser beam OL may be introduced into the vacuum chamber 1130 through the aperture 1141 of the collector mirror 1140.

The droplet generator 1150 may generate a droplet that generates the EUV light EL by interacting with the laser beam OL, and may provide the droplet into the vacuum chamber 1130. The droplet may include at least one of tin (Sn), lithium (Li), and xenon (Xe). For example, the droplet may include at least one of tin (Sn), a tin compound (e.g., $SnBr_4$, $SnBr_2$, or SnH), and a tin alloy (e.g., Sn—Ga, Sn—In, or Sn—In—Ga).

The droplet catcher 1160 is under the droplet generator 1150 and may be configured to collect droplets that have not reacted with the laser beam OL. The droplet provided from the droplet generator 1150 may react with the laser beam OL introduced into the vacuum chamber 1130 to generate the EUV light EL. The collector mirror 1140 may collect and reflect the EUV light EL, thereby emitting the EUV light EL to the illumination optical system 1200 arranged outside the vacuum chamber 1130.

The illumination optical system 1200 includes a plurality of reflecting mirrors, and may transmit the EUV light EL emitted from the EUV light source 1100 to an EUV photomask 100. For example, the EUV light EL emitted from the EUV light source 1100 may be reflected by a reflecting mirror in the illumination optical system 1200 and incident on the EUV photomask 100 arranged on the photomask support 1300.

The EUV photomask 100 may be a reflective mask having a reflective area and a non-reflective (or intermediate reflective) area. The EUV photomask 100 may include a reflective multilayer film formed on a mask substrate including a material having a lower thermal expansion coefficient such as silicon (Si) and an absorption pattern formed on the reflective multilayer film. The reflective multilayer film may correspond to a reflective area, and the absorption pattern may correspond to a non-reflective (or intermediate reflective) area.

The EUV photomask 100 reflects the EUV light EL incident from the illumination optical system 1200 and makes the EUV light EL be incident on the projection optical system 1400. For example, the EUV photomask 100 structures the light incident from the illumination optical system 1200 as projection light and makes the light be incident on the projection optical system 1400, based on a pattern shape formed by the reflective multilayer film and the absorption pattern on the mask substrate. The projection light may be structured through at least a second diffraction order due to the EUV photomask 100. The projection light is incident on the projection optical system 1400 while holding information about a pattern shape of the EUV photomask 100, and may pass through the projection optical system 1400 to form an image corresponding to the pattern shape of the EUV photomask 100 on a semiconductor substrate 200. Details of the EUV photomask 100 according to example embodiments will be described later below.

The projection optical system 1400 may include a plurality of reflecting mirrors 1410 and 1430. In the drawing, two reflecting mirrors 1410 and 1430 are shown in the projection optical system 1400, but this is for convenience of description, and the projection optical system 1400 may include more reflecting mirrors. For example, the projection optical system 1400 may generally include 4 to 8 reflecting mirrors. However, the number of reflecting mirrors included in the projection optical system 1400 is not limited to the above value.

The semiconductor substrate 200 may be on the substrate stage 1500. The substrate stage 1500 may move in X and Y directions on an X-Y plane, and may move in a Z direction perpendicular to the X-Y plane. By the movement of the substrate stage 1500, the semiconductor substrate 200 may also move in the X direction, the Y direction, and the Z direction in the same manner.

Figure 2:
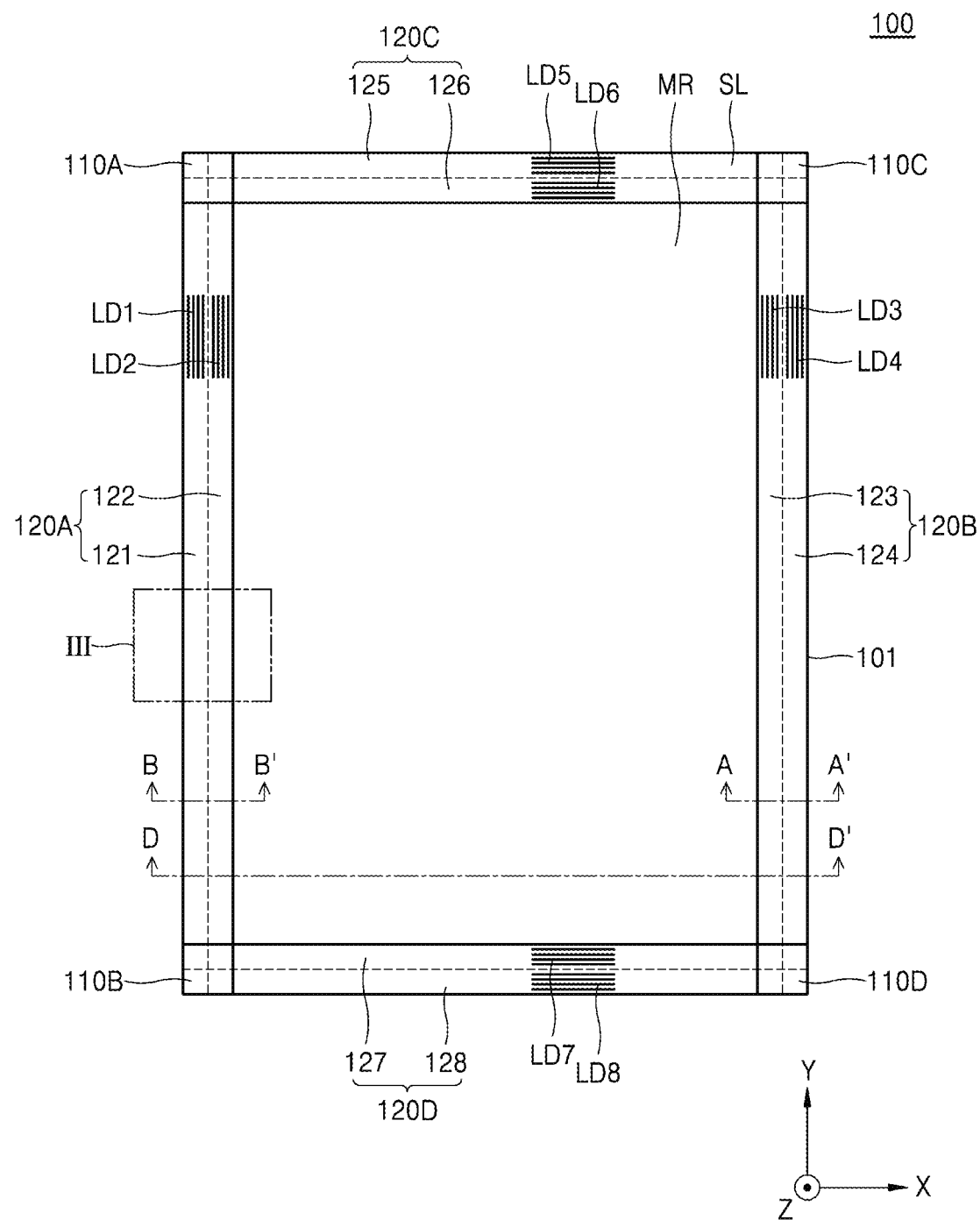
FIG. 2 is a plan view of an EUV photomask according to example embodiments.
Figure 3:
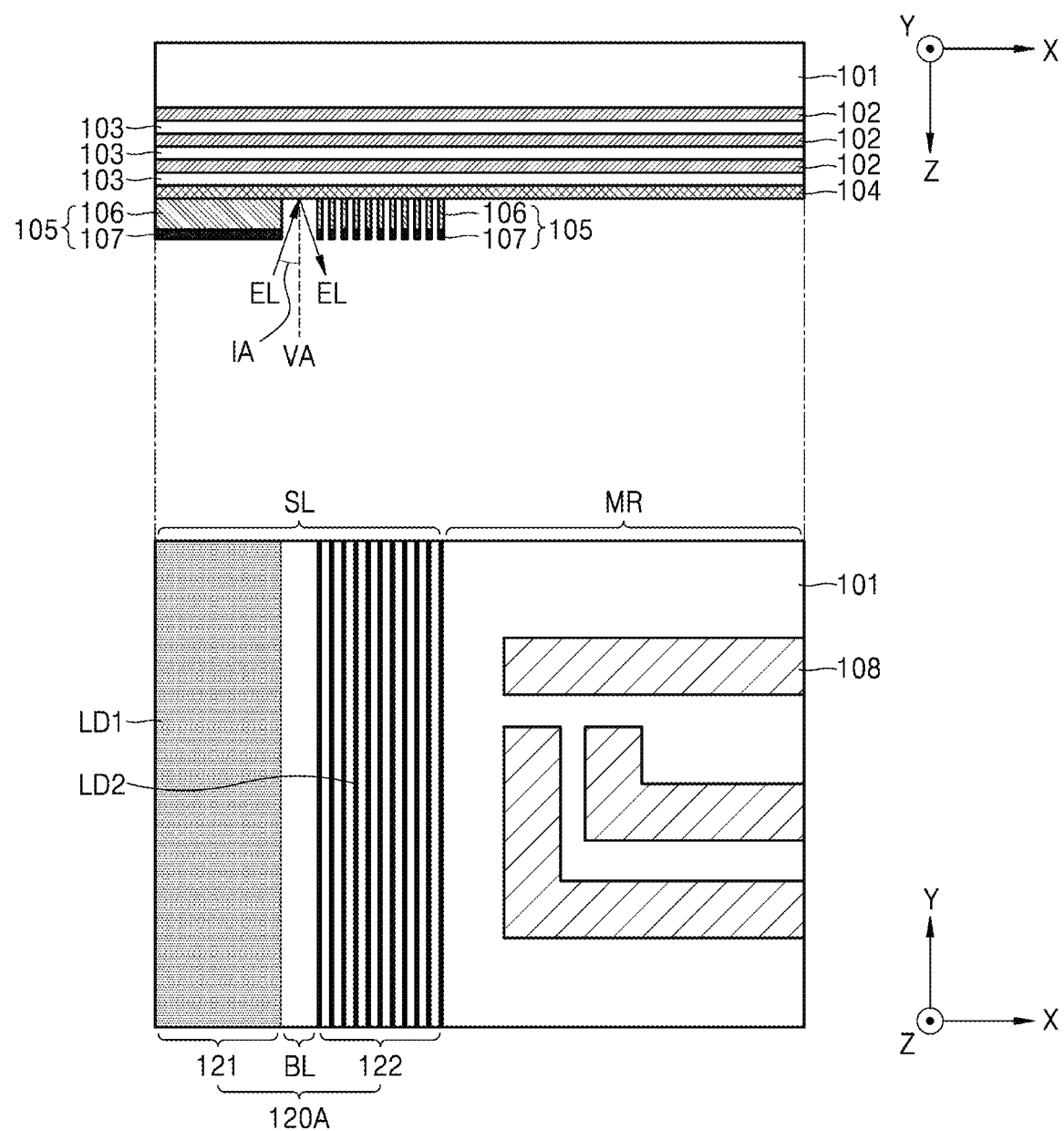
FIG. 3 is an enlarged cross-section and plan view of region III of FIG. 2.

FIG. 2 is a plan view of an EUV photomask according to example embodiments, and FIG. 3 is an enlarged cross-section and plan view of region III of FIG. 2.

Referring to FIGS. 2 and 3 together, the EUV photomask 100 may include a main area MR on a mask substrate 101 and a scribe lane area SL surrounding the main area MR.

The mask substrate 101 may include a material having a lower thermal expansion coefficient such as Si. Alternatively, the mask substrate 101 may include quartz, glass, plastic, or the like. The EUV photomask 100 may include reflective multilayer films 102, 103, and 104 formed on the mask substrate 101 and an absorption pattern 105 formed on the reflective multilayer films 102, 103, and 104.

The reflective multilayer films 102, 103, and 104 may include a material that reflects the EUV light EL. The reflective multilayer films 102, 103, and 104 may have, for example, a structure in which the silicon film 102 and the molybdenum film 103 are alternately stacked. For example, the silicon layer 102 and the molybdenum layer 103 may be stacked in tens of layers, and the thickness thereof may vary. In addition, the ruthenium film 104 different from the silicon layer 102 and the molybdenum layer 103 may be on the uppermost layer of the reflective multilayer films 102, 103, and 104.

The absorption pattern 105 may include a material that absorbs the EUV light EL. The absorption pattern 105 may include, for example, TaN, TaNO, TaBO, TaBN, Lr, or the like. In some example embodiments, the absorption pattern 105 has a multilayer structure, and may include a tantalum boron nitride layer 106 and a lawrencium layer 107. However, the structure of the absorption pattern 105 is not limited thereto.

The EUV light EL is incident toward the EUV photomask 100 with an incident angle IA, and is reflected with a reflection angle on a vertical axis VA perpendicular to the EUV photomask 100. In some example embodiments, the incident angle IA of the EUV light EL may have a range of about 5° to about 7°, but is not limited thereto.

In the main area MR, a main pattern 108 for patterning a cell layer or a core/peri layer may be formed. The main pattern 108 formed on the mask substrate 101 may be a portion of the absorption pattern 105 or may be formed as a complementary pattern of the absorption pattern 105.

The scribe lane area SL may include a first lane 120A and a second lane 120B extending in the Y direction on both sides of the main area MR, respectively. In addition, the scribe lane area SL may include a third lane 120C and a fourth lane 120D extending in the X direction perpendicular to the first lane 120A and the second lane 120B on the other sides of the main area MR, respectively.

The first lane 120A may include a first sub-lane 121 and a second sub-lane 122 extending in the same length direction. In addition, the second lane 120B may include a third sub-lane 123 and a fourth sub-lane 124 extending in the same length direction.

The third lane 120C may include a fifth sub-lane 125 and a sixth sub-lane 126 extending in the same length direction. In addition, the fourth lane 120D may include a seventh sub-lane 127 and an eighth sub-lane 128 extending in the same length direction.

Although the first sub-lane 121 and the second sub-lane 122 are shown to be in contact with and adjacent to each other and the third sub-lane 123 and the fourth sub-lane 124 are shown to be in contact with and adjacent to each other, they are not limited thereto. For example, the first sub-lane 121 and the second sub-lane 122 may be apart from each other with a blank area BL therebetween. In addition, the third sub-lane 123 and the fourth sub-lane 124 may also be apart from each other with a blank area therebetween. Likewise, a blank area may be between the fifth sub-lane 125 and the sixth sub-lane 126 and/or between the seventh sub-lane 127 and the eighth sub-lane 128.

The first sub-lane 121 may have a first dummy pattern LD1, and the second sub-lane 122 may have a second dummy pattern LD2. A dummy pattern refers to a pattern in which the same pattern as the dummy pattern is not formed on a photoresist after undergoing exposure and development processes. In some example embodiments, the dummy pattern has a dimension that is less than or equal to the resolution, so that the pattern is not transferred to the photoresist.

Similarly, the third sub-lane 123 may have a third dummy pattern LD3, and the fourth sub-lane 124 may have a fourth dummy pattern LD4. In addition, the fifth sub-lane 125 may have a fifth dummy pattern LD5, and the sixth sub-lane 126 may have a sixth dummy pattern LD6. Also, the seventh sub-lane 127 may have a seventh dummy pattern LD7, and the eighth sub-lane 128 may have an eighth dummy pattern LD8.

In some example embodiments, the first dummy pattern LD1 and the second dummy pattern LD2 may be mirror-symmetrical to the fourth dummy pattern LD4 and the third dummy pattern LD3 with respect to the main area MR, respectively. In addition, the fifth dummy pattern LD5 and the sixth dummy pattern LD6 may be mirror-symmetrical to the eighth dummy pattern LD8 and the seventh dummy pattern LD7 with respect to the main area MR, respectively.

In other example embodiments, the first dummy pattern LD1 and the second dummy pattern LD2 may be the same as the fourth dummy pattern LD4 and the third dummy pattern LD3, respectively. In addition, the fifth dummy pattern LD5 and the sixth dummy pattern LD6 may be the same as the eighth dummy pattern LD8 and the seventh dummy pattern LD7, respectively.

Figure 4:
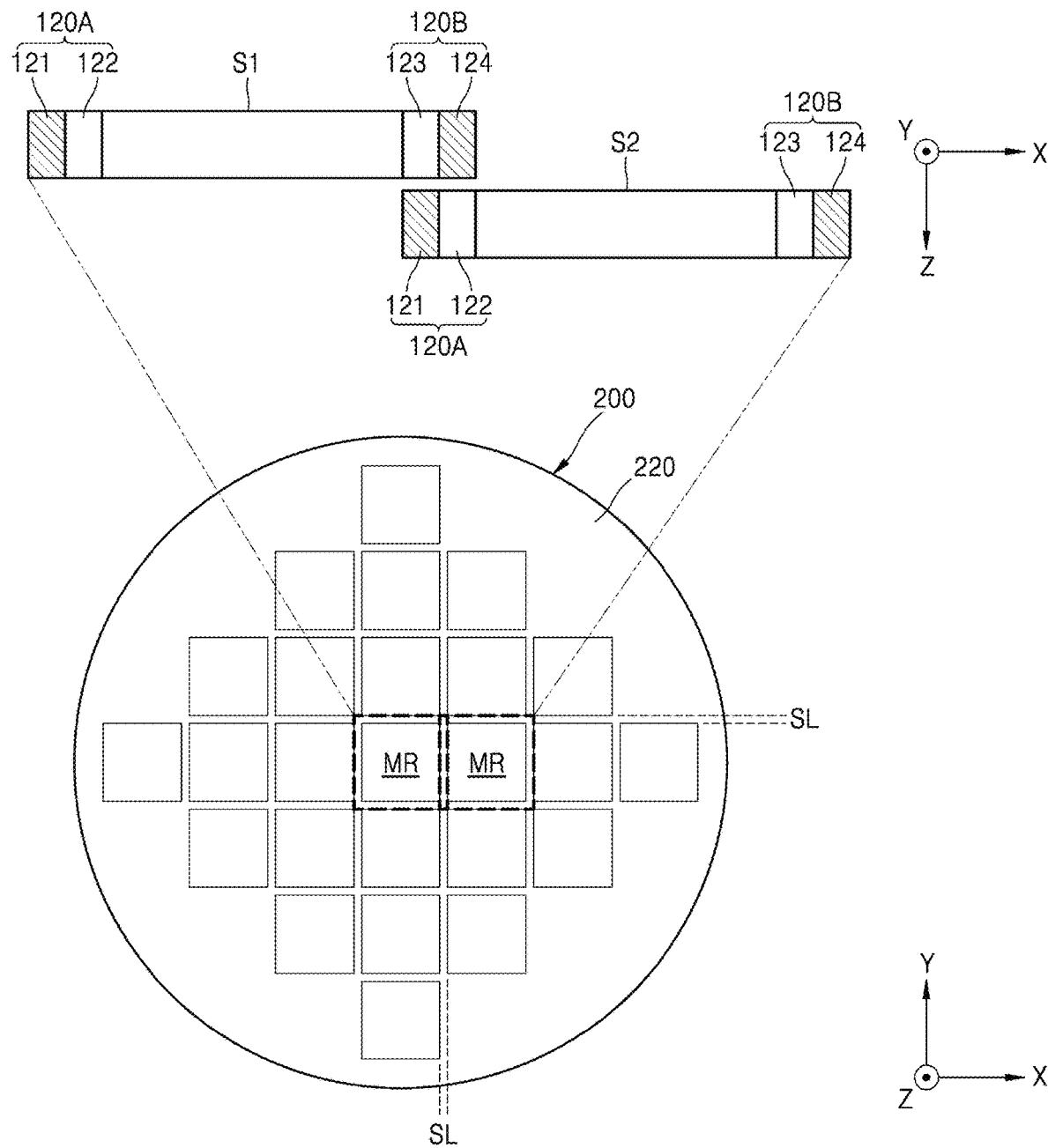
FIGS. 4 and 5 are conceptual diagrams illustrating a method of exposing a mask pattern on a semiconductor substrate in a step and repeat method using an EUV photomask according to example embodiments.
Figure 5:
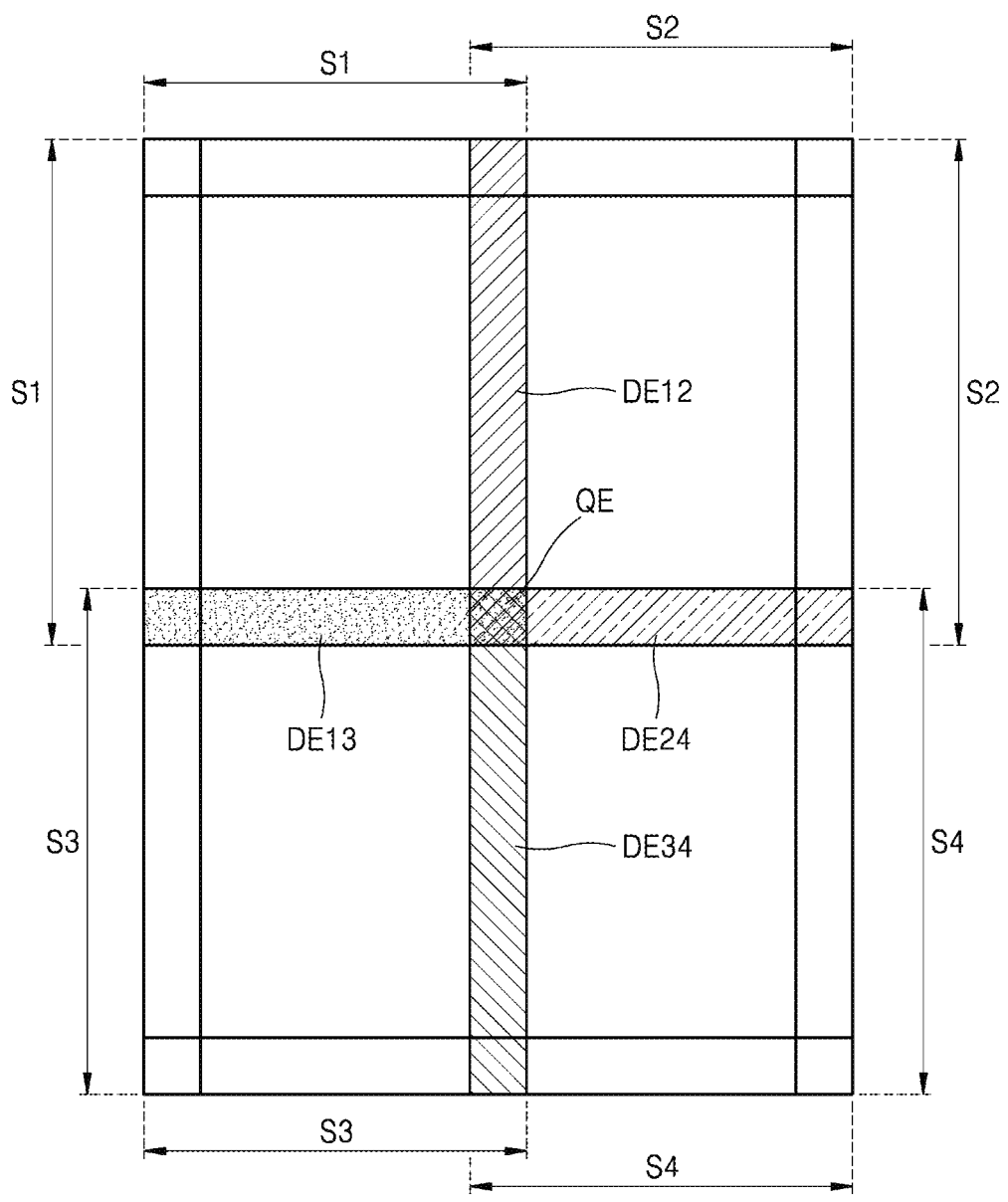
Figure 5:
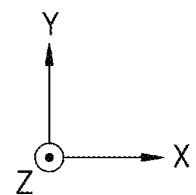

FIGS. 4 and 5 are conceptual diagrams illustrating a method of exposing a mask pattern on a semiconductor substrate in a step and repeat method using an EUV photomask according to example embodiments.

FIGS. 4 and 5 together show that the mask pattern is exposed on the semiconductor substrate 200 by repeating at least two steps.

Shot 1 (S1) and the subsequent shot 2 (S2) may be adjusted so that scribe lane areas SL overlap each other. For example, the shot 1 (S1) and the subsequent shots 2 (S2) may be adjusted so that the second lane 120B of the shot 1 (S1) and the first lane 120A of the shot 2 (S2) overlap each other in a double overlap area DE12.

Shot 3 (S3), which is performed after shot 2 (S2) and exposed to a lower portion in the Y direction of a position where the shot 1 (S1) is performed, may be adjusted so that the shot 1 (S1) and the scribe lane area SL overlap each other. That is, the shot 1 (S1) and the shot 3 (S3) may be adjusted so that the fourth lane 120D of the shot 1 (S1) and the third lane 120C of the shot 3 (S3) overlap each other in a double overlap area DE13.

The shot 3 (S3) and the subsequent shot 4 (S4) may be adjusted so that the scribe lane areas SL overlap each other. For example, the shot 3 (S1) and the subsequent shot 4 (S2) may be adjusted so that the second lane 120B of the shot 3 (S1) and the first lane 120A of the shot 4 (S2) overlap each other in a double overlap area DE34. In addition, because the shot 4 (S4) may be exposed to a lower portion in the Y direction of a position where the shot 2 (S2) is performed, the shot 2 (S2) and the shot 4 (S4) may be adjusted so that the fourth lane 120D of the shot 2 (S2) and the third lane 120C of the shot 4 (S4) overlap each other in a double overlap area DE24.

As described above, when exposure is performed by repeating the steps 4 times, a quadruple overlap area QE may be formed between the double overlap area DE12 and the double overlap area DE34, and between the double overlap area DE13 and the double overlap area DE24.

As a result, EUV light for exposure is irradiated once to the main area MR, but may be irradiated twice to the double overlap areas DE12, DE13, DE24, and DE34, and four times to the quadruple overlap area QE.

Figure 6A:
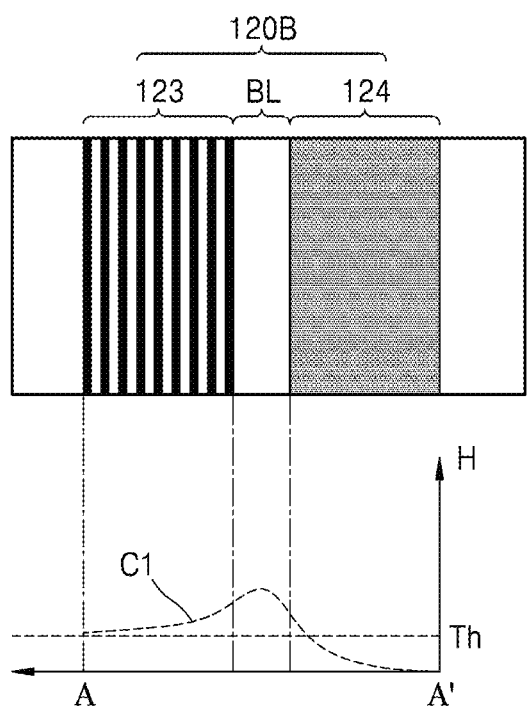
FIGS. 6A to 6C are conceptual diagrams illustrating the amount of irradiated light when two overlapping exposures are performed, along lines A-A' and B-B' of FIG. 2.
Figure 6B:
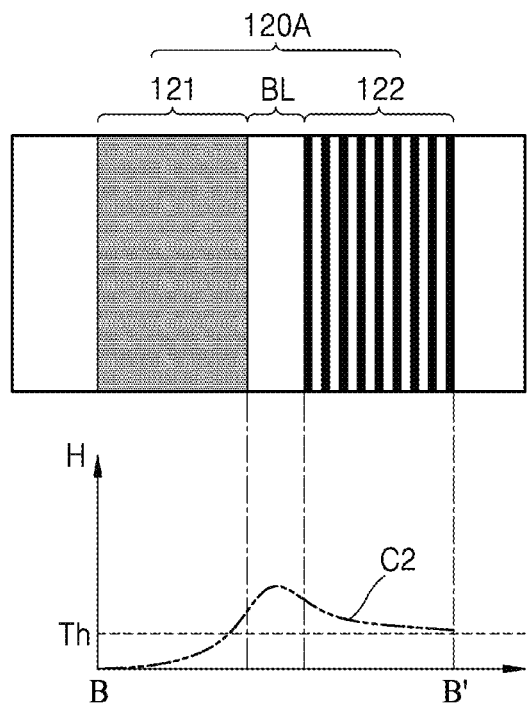
Figure 6C:
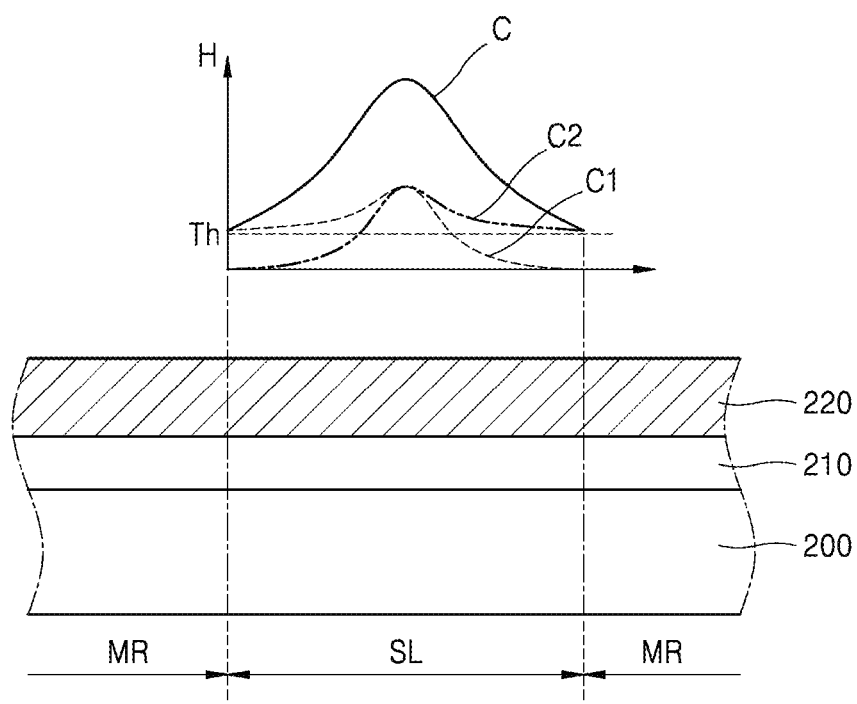
Figure 6D:
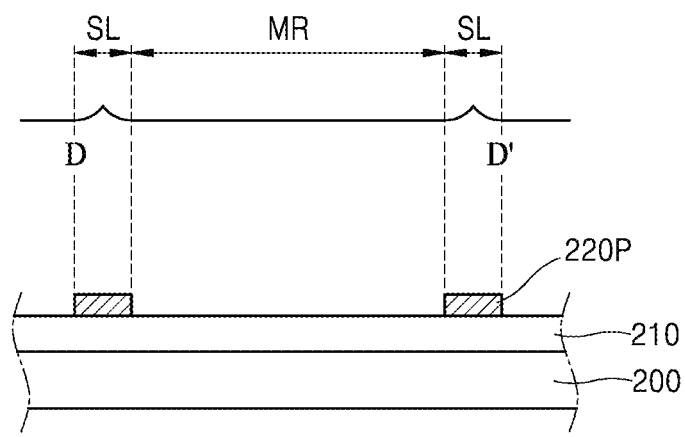
FIG. 6D is a conceptual diagram illustrating the amount of light exposed along line D-D' of FIG. 2 and a mask pattern corresponding thereto.

FIGS. 6A to 6C are conceptual diagrams illustrating the amount of irradiated light when two overlapping exposures are performed, along lines A-A' and B-B' of FIG. 2, and FIG. 6D is a conceptual diagram illustrating the amount of light exposed along line D-D' of FIG. 2 and a mask pattern corresponding thereto.

Referring to FIGS. 5 and 6A together, when the shot 1 (S1) is performed, a corresponding area of the double overlap area DE12 may be exposed by the second lane 120B.

When the shot 1 (S1) is performed, because EUV light is hardly reflected (e.g., because most of the EUV light is absorbed by an absorption pattern) in a portion corresponding to the fourth sub-lane 124, the amount of reflected light H is zero or close to zero. However, due to diffraction of EUV light reflected by the blank area BL, near the boundary between the blank area BL and the fourth sub-lane 124, even an area absorbed by the fourth sub-lane 124 may be irradiated with some EUV light. In addition, a portion corresponding to the third sub-lane 123 may be irradiated by reflecting EUV light having a smaller amount of light H than that of the blank area BL by a line-and-space pattern.

As a result, the distribution of the amount of EUV light reflected by the second lane 120B may be the same as the distribution C2. In some example embodiments, the line and space pattern of the third sub-lane 123 may be adjusted so that the amount of light H reflected by the third sub-lane 123 exceeds a threshold amount of light Th, or is at least close to the threshold amount of light Th.

Referring to FIGS. 5 and 6B together, when the shot 2 (S2) is performed, a corresponding area of the double overlap area DE12 may be exposed by the first lane 120A.

When the shot 2 (S2) is performed, because EUV light is hardly reflected (e.g., because most of the EUV light is absorbed by an absorption pattern) in a portion corresponding to the first sub-lane 121, the amount of reflected light H is zero or close to zero. However, due to diffraction of EUV light reflected by the blank area BL, near the boundary between the blank area BL and the first sub-lane 121, even an area absorbed by the first sub-lane 121 may be irradiated with some EUV light. In addition, a portion corresponding to the second sub-lane 122 may be irradiated by reflecting EUV light having the smaller amount of light H than that of the blank area BL by a line-and-space pattern.

As a result, the distribution of the amount of EUV light reflected by the first lane 120A may be the same as the distribution C2. In some example embodiments, the line and space pattern of the second sub-lane 122 may be adjusted so that the amount of light H reflected by the second sub-lane 122 exceeds the threshold amount of light Th, or is at least close to the threshold amount of light Th.

In some example embodiments, the line and space pattern of the second sub-lane 122 may be mirror-symmetric with the line and space pattern of the third sub-lane 123 with respect to the main area MR. In other example embodiments, the line and space pattern of the second sub-lane 122 may be the same as the line and space pattern of the third sub-lane 123.

In some example embodiments, a block pattern of the first sub-lane 121 may be mirror-symmetric with a block pattern of the fourth sub-lane 124 with respect to the main area MR. In other example embodiments, the block pattern of the first sub-lane 121 may be the same as the block pattern of the fourth sub-lane 124.

In some example embodiments, the width of the first sub-lane 121 in the X direction may be the same as the width of the second sub-lane 122 in the X direction. In other example embodiments, the width of the first sub-lane 121 in the X direction may be different from the width of the second sub-lane 122 in the X direction.

Referring to FIG. 6C, the amount of light H of a curve C to which two curves C1 and C2 are added is irradiated to the scribe lane area SL (for example, in a double overlap area), which indicates that EUV light having an amount exceeding the threshold amount of light Th is irradiated to the entire scribe lane area SL.

In some example embodiments, the amount of light H irradiated to the entire scribe lane area SL after two overlapping exposures as shown in the curve C may be in the range of about 105% to about 150%, about 105% to about 140%, about 105% to about 130%, or about 105% to about 125% of the threshold amount of light Th.

When a photoresist material layer 220 is developed to pattern a target material layer 210 on the semiconductor substrate 200, the photoresist material layer 220 remains in the scribe lane area SL without being removed, and the photoresist material layer 220 in the main area MR may be removed or remain depending on the presence or absence of the main pattern 108 (see FIG. 3) arranged in the main area MR.

The photoresist material layer 220 used in the EUV exposure apparatus 1000 (see FIG. 1A) is deposited at a temperature of about 80° C. to about 150° C., and may be formed to a thickness of about 200 nm to about 600 nm, but the deposition temperature and the thickness are not limited to the above values.

In general, a chemically amplified photoresist material may be used for a photoresist used for negative tone development (NTD), an exposed portion may remain, and an unexposed portion (e.g., a portion that is not irradiated with light above the threshold amount of light) may be removed by a solvent.

In example embodiments, the EUV photomask 100 (see FIG. 2) refers to a reticle used to expose the photoresist material layer 220 in order to pattern the photoresist material layer 220 used in such NTD in a desired pattern and will be understood by one of ordinary skill in the art.

Referring to FIG. 6D, EUV light is irradiated only to a portion corresponding to the scribe lane area SL by a required amount of light, so that a photoresist pattern 220P corresponding to the scribe lane area SL may be formed with an appropriate width.

If necessary, by performing anisotropic etching or isotropic etching using the photoresist pattern 220P as an etching mask, the target material layer 210 on the semiconductor substrate 200 may be patterned in a desired pattern.

Although it has been described that the first sub-lane 121 has a dummy pattern that is a block pattern and the second sub-lane 122 has a dummy pattern that is a line-and-space pattern in FIGS. 6A to 6D, one of ordinary skill in the art will understand that the first sub-lane 121 may have a dummy pattern that is a line-and-space pattern, and the second sub-lane 122 may have a dummy pattern that is a block pattern. In addition, although the description has been made for the double overlap area DE12 of the scribe lane area SL, one of ordinary skill in the art will understand that the same principle may be applied to the other double overlap areas DE13, DE24, and DE34.

Figure 7A:
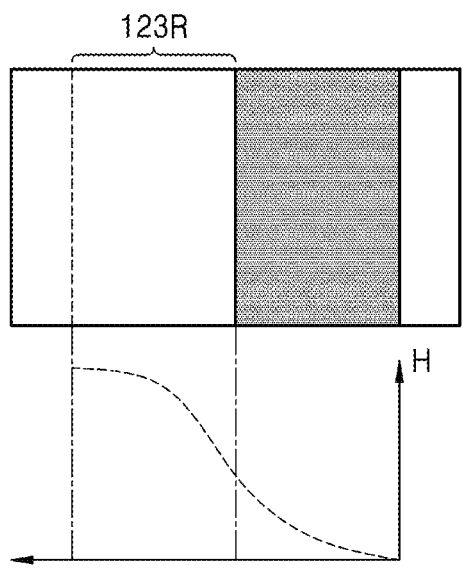
FIGS. 7A to 7C are conceptual diagrams illustrating the formation of a scribe lane pattern when one sub-lane has a block pattern and the other sub-lane is in a blank state according to a comparative example.
Figure 7B:
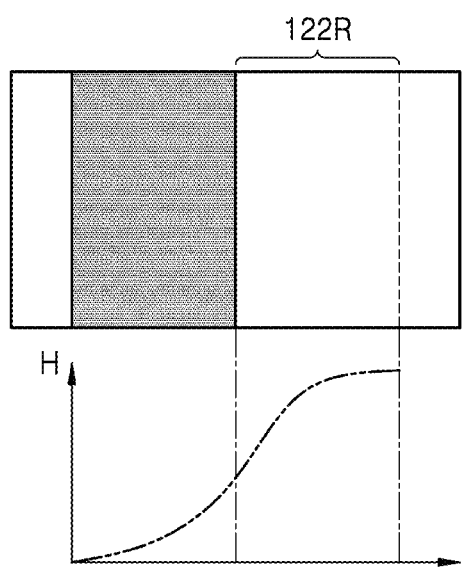
Figure 7C:
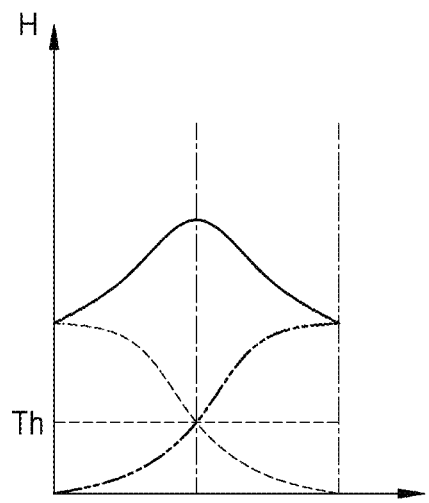
Figure 7D:
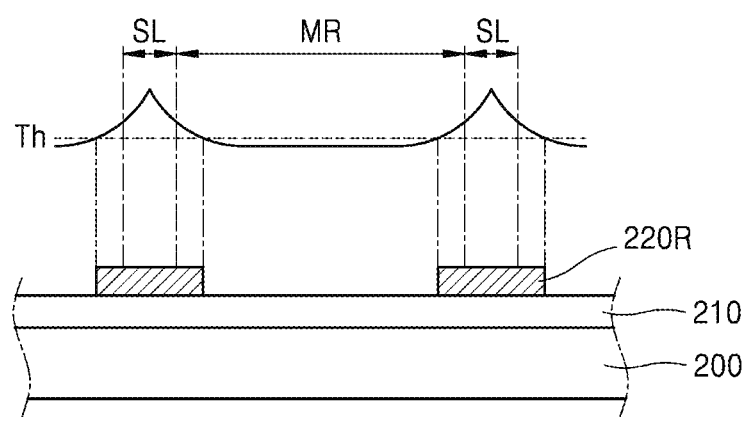
FIG. 7D is a conceptual diagram illustrating the distribution of the amount of irradiated light when two overlapping exposures are performed according to a comparative example.

FIGS. 7A to 7C are conceptual diagrams illustrating the formation of a scribe lane pattern when one sub-lane has a block pattern and the other sub-lane is in a blank state according to a comparative example, and FIG. 7D is a conceptual diagram illustrating the distribution of the amount of irradiated light when two overlapping exposures are performed according to a comparative example.

FIGS. 7A and 7B are the same or substantially the same as those of FIGS. 6A and 6B except that there is not a line-and-space pattern, and thus, this difference will be mainly described.

Referring to FIG. 7A, because there is not a line and space pattern in an area 123R corresponding to the third sub-lane 123 of FIG. 6A, when the shot 1 (S1) is performed, the amount of light H reflected through an area corresponding to the third sub-lane 123 becomes excessive.

Referring to FIG. 7B, similarly, because there is not a line and space pattern in an area 122R corresponding to the second sub-lane 122 of FIG. 6B, when the shot 2 (S2) is performed, the amount of light H reflected through an area corresponding to the second sub-lane 122 becomes excessive.

Referring to FIG. 7C, the maximum value of the amount of light H reflected after performing both the shot 1 (S1) and shot 2 (S2) far exceeds the threshold amount of light Th, and the minimum value also significantly exceeds the threshold amount of light Th.

Referring to FIG. 7D, a photoresist pattern 220R having a width greater than an intended width of the scribe lane area SL is obtained by irradiating light exceeding the threshold amount of light Th to an adjacent area outside the scribe lane area SL.

In example embodiments of the comparative example different from the inventive concepts, because the main area MR is also affected, a mask pattern of the main area MR may need to be restarted from a design stage. For example, because EUV light required to form the scribe lane area SL excessively invades the main area MR, such an effect needs to be considered. That is, it is necessary to repeatedly design and verify the mask pattern of the main area MR for generating a cell circuit pattern or a core/peri circuit pattern by trial and error or computer simulation. Accordingly, a longer period and/or additional cost may be required to manufacture an EUV photomask for product production.

In contrast, as previously described with reference to FIG. 6D, when using the EUV photomask 100 (see FIG. 2) according to example embodiments of the inventive concepts, because EUV light irradiated to the adjacent area outside the scribe lane area SL is insignificant, it is possible to more easily and/or more simply design the pattern of the main area MR and apply the pattern immediately.

Ultimately, the EUV photomask 100 (see FIG. 2) according to the technical ideas of the inventive concepts may be designed and manufactured less expensively, quicker, and/or with fewer defects. Therefore, when a mask pattern is formed on the semiconductor substrate 200 by using the EUV photomask 100, example embodiments in which reflected EUV light is unnecessarily scattered and has an undesired effect on the main area MR may be reduced or prevented.

Figure 8A:
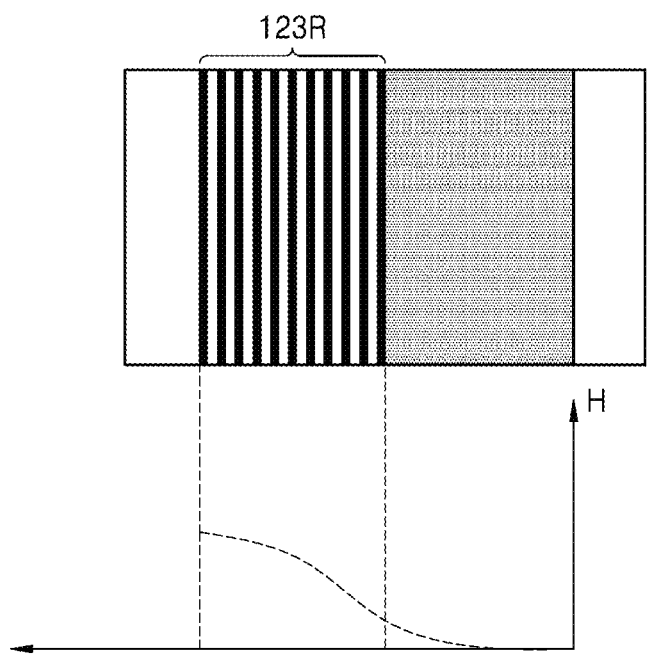
FIGS. 8A to 8C are conceptual diagrams showing the formation of a scribe lane pattern when a line and space pattern is added without a blank area to a comparative example.
Figure 8B:
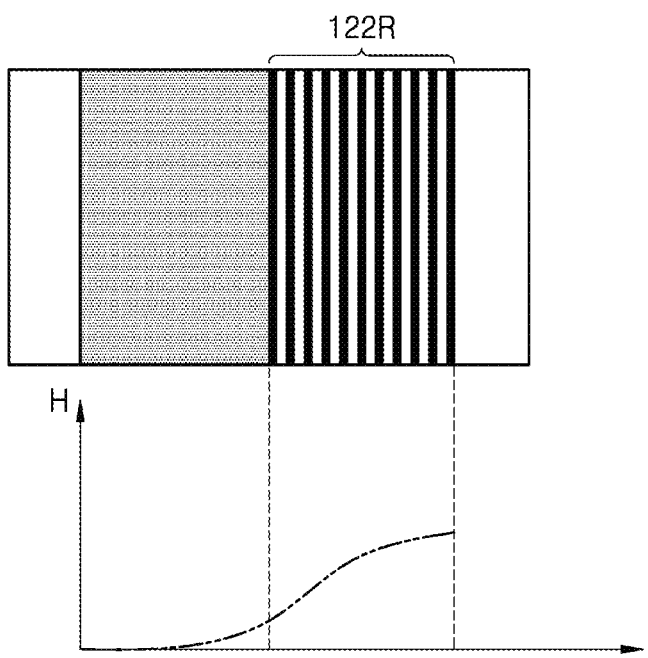
Figure 8C:
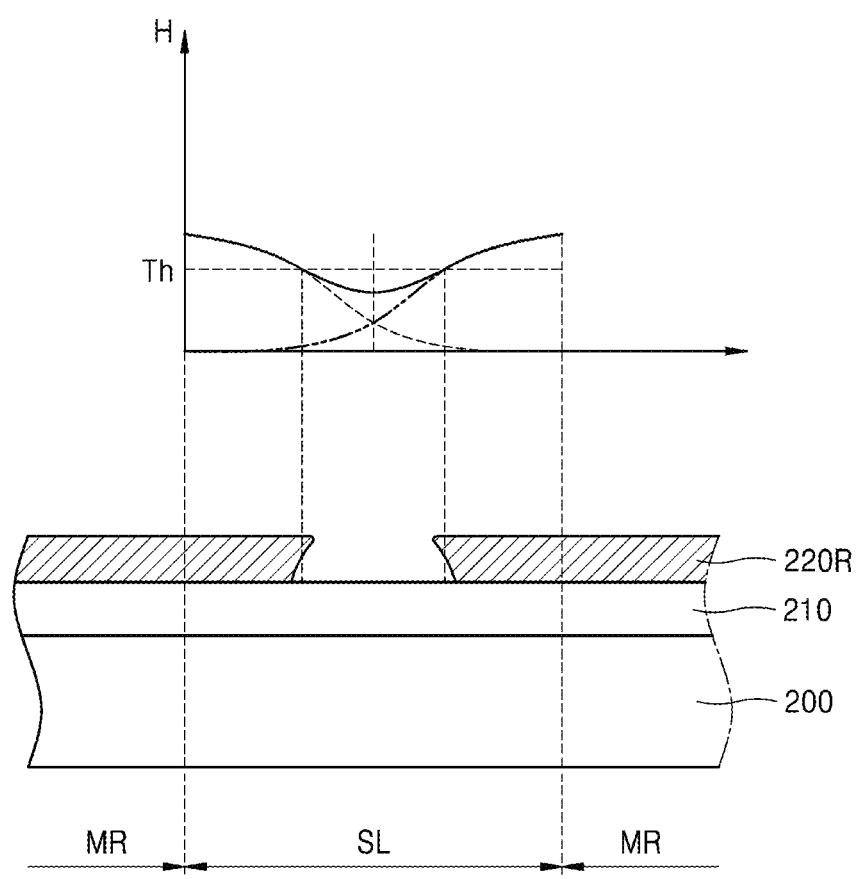

FIGS. 8A to 8C are conceptual diagrams illustrating formation of a scribe lane pattern when a line and space pattern without a blank area is added to the comparative examples of FIGS. 7A to 7D.

FIGS. 8A and 8B are the same as those of FIGS. 6A and 6B except that a line and space pattern is added without a blank area, and thus, this difference will be mainly described.

Referring to FIG. 8A, because there is a line and space pattern in the area 123R corresponding to the third sub-lane 123 of FIG. 6A, and there is no blank area between the line and space pattern and a block pattern, when the shot 1 (S1) is performed, the amount of light H reflected through the area 123R corresponding to the third sub-lane 123 is insufficient.

Referring to FIG. 8B, similarly, because there is a line and space pattern in the area 122R corresponding to the second sub-lane 122 of FIG. 6B, and there is no blank area between the line and space pattern and a block pattern, when the shot 2 (S2) is performed, the amount of light H reflected through the area 122R corresponding to the second sub-lane 122 is insufficient.

Referring to FIG. 8C, the amount of light H reflected after performing both the shot 1 (S1) and shot 2 (S2) has a concave distribution in the center. In particular, in the concave center portion, the amount of light H may be lower than the threshold amount of light Th. In performing NTD, because a portion with an exposure amount less than the threshold amount of light Th is removed by a solvent, the photoresist pattern 220R having a defect in the center portion of the scribe lane area SL may be obtained.

Therefore, in performing NTD, when a dummy pattern as a block pattern and a dummy pattern as a line and space pattern are arranged adjacent to each other without a blank area, an unwanted photoresist pattern may be obtained.

Unlike this, as previously seen in FIG. 6D, when the EUV photomask 100 (see FIG. 2) according to example embodiments is used, a sufficient amount of light may be secured even in the center portion of the scribe lane area SL, so that a defect such as the unwanted photoresist pattern 220R does not occur.

Figure 9A:
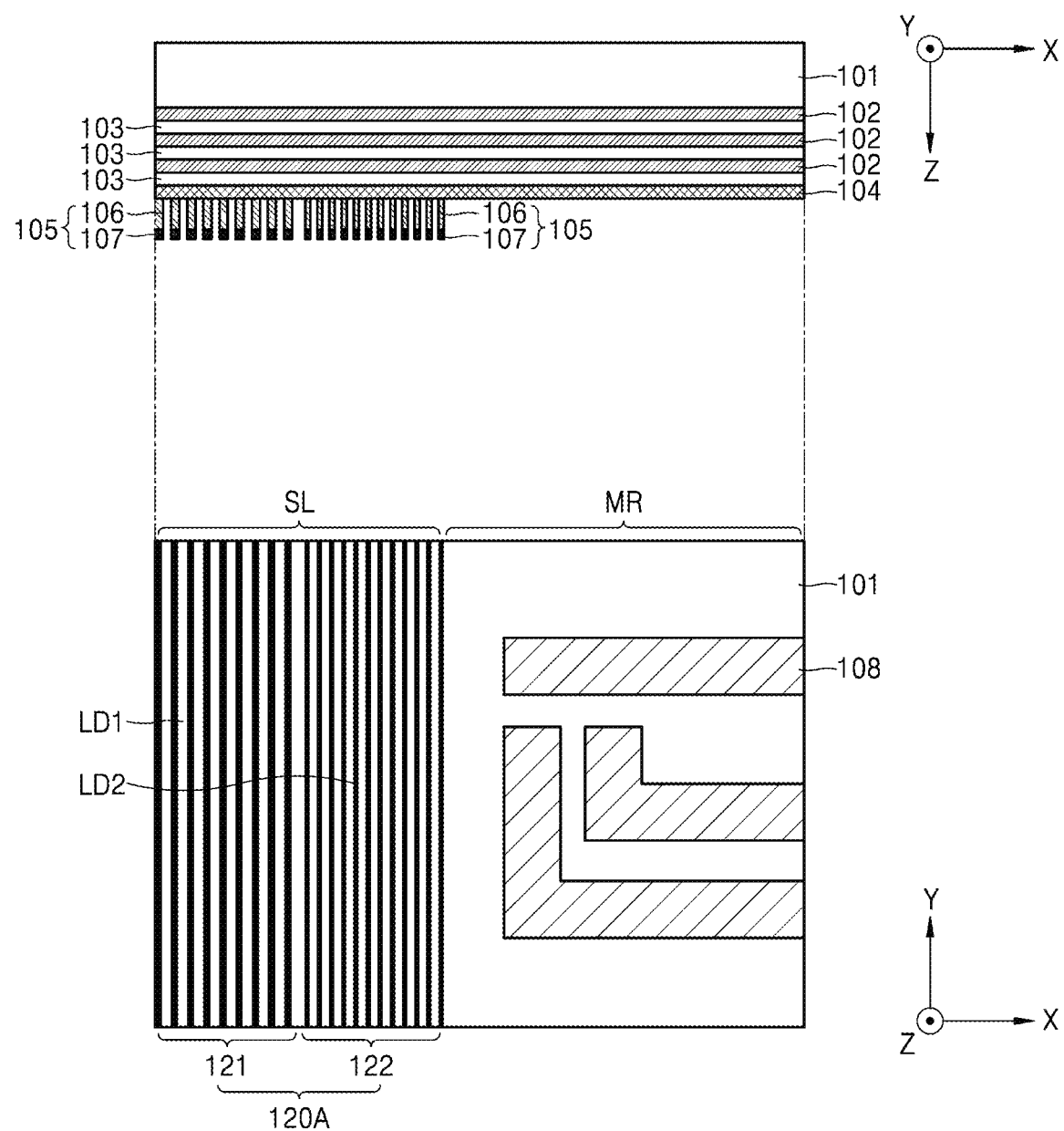
FIG. 9A is a conceptual diagram of dummy patterns on two neighboring sub-lanes in an EUV photomask according to example embodiments.
Figure 9B:
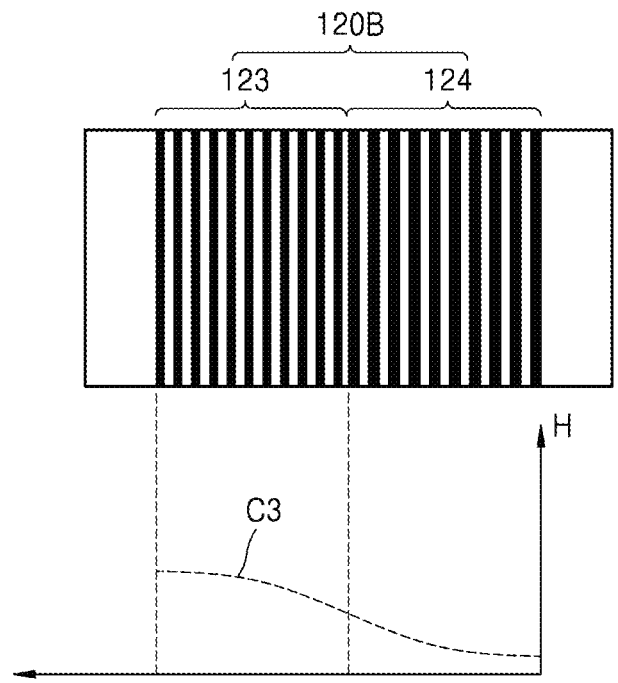
FIGS. 9B to 9D are conceptual diagrams illustrating formation of a scribe lane pattern when two overlapping exposures are performed using the EUV photomask of FIG. 9A.
Figure 9C:
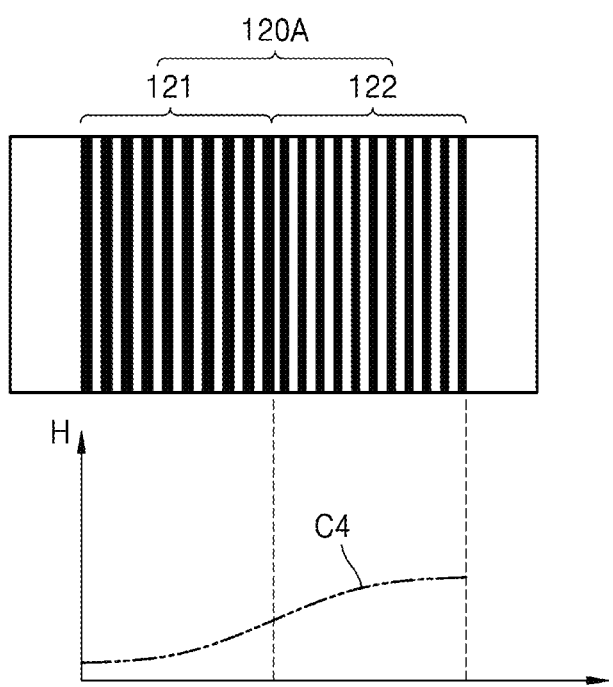
Figure 9D:
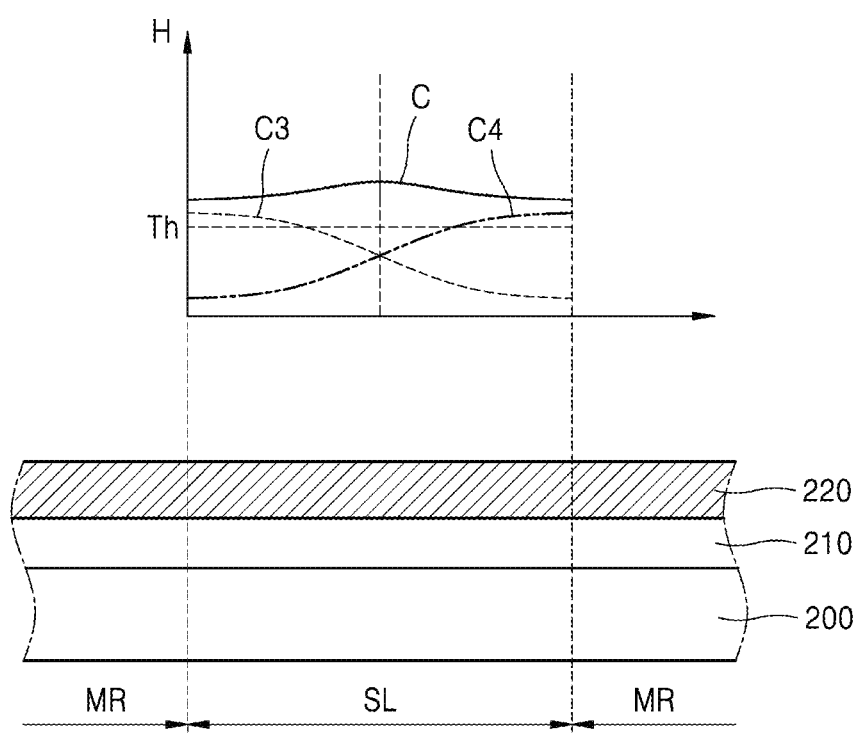

FIG. 9A is a conceptual diagram of dummy patterns on two neighboring sub-lanes in an EUV photomask according to example embodiments, and FIGS. 9B to 9D are conceptual diagrams illustrating formation of a scribe lane pattern when two overlapping exposures are performed using the EUV photomask of FIG. 9A.

Referring to FIG. 9A, the first lane 120A may include the first sub-lane 121 having the first dummy pattern LD1 and the second sub-lane 122 having the second dummy pattern LD2.

Each of the first dummy pattern LD1 and the second dummy pattern LD2 may be a line-and-space pattern extending in the Y direction, which is an extending direction of the first lane 120A. In some example embodiments, each of the first dummy pattern LD1 and the second dummy pattern LD2 may be a line and space pattern extending in the X direction perpendicular to the Y direction, which is the extending direction of the first lane 120A. The first dummy pattern LD1 and the second dummy pattern LD2 may be the same or different from each other.

In some example embodiments, the first dummy pattern LD1 may have relatively lower light reflectivity than the second dummy pattern LD2. The light reflectivity of the first dummy pattern LD1 and the second dummy pattern LD2 may be controlled by adjusting the pitch of a line-and-space pattern and/or the width of a line.

Referring to FIGS. 5 and 9B together, when the shot 1 (S1) is performed, a corresponding area of the double overlap area DE12 may be exposed by the second lane 120B.

It is assumed that the second lane 120B includes the third sub-lane 123 having the same dummy pattern as the second dummy pattern LD2 and the fourth sub-lane 124 having the same dummy pattern as the first dummy pattern LD1.

Because the light reflectivity of the second dummy pattern LD2 is higher than that of the first dummy pattern LD1, when the shot 1 (S1) is performed, the amount of light reflection of the third sub-lane 123 is relatively higher than that of the fourth sub-lane 124. However, because the difference in the light reflectivity between the first dummy pattern LD1 and the second dummy pattern LD2 is not relatively great, the variation in the amount of light reflection depending on the location may be relatively small.

As a result, the distribution of the amount of EUV light reflected by the second lane 120B may be the same as the distribution C3. The amount of light H reflected by the third sub-lane 123 and the fourth sub-lane 124 may slightly exceed or be slightly less than the threshold amount of light Th.

Referring to FIGS. 5 and 9C together, when the shot 2 (S2) is performed, a corresponding area of the double overlap area DE12 may be exposed by the first lane 120A.

Because the light reflectivity of the second dummy pattern LD2 is higher than that of the first dummy pattern LD1, when the shot 2 (S2) is performed, the amount of light reflection of the second sub-lane 122 is relatively higher than that of the first sub-lane 121. However, because the difference in the light reflectivity between the first dummy pattern LD1 and the second dummy pattern LD2 is not relatively great, the variation in the amount of light reflection depending on the location may be relatively small.

As a result, the distribution of the amount of EUV light reflected by the first lane 120A may be the same as the distribution C4. The amount of light H reflected by the first sub-lane 121 and the second sub-lane 122 may slightly exceed or be slightly less than the threshold amount of light Th.

Referring to FIGS. 5 and 9D together, by two overlapping exposures, EUV light is irradiated to the double overlap area DE12 as a light quantity distribution of curve C, which is the sum of a light quantity distribution C4 reflected by the first lane 120A and a light quantity distribution C3 reflected by the second lane 120B. The light quantity distribution of the curve C generally exceeds the threshold amount of light Th, but has a relatively constant distribution without much exceeding the threshold amount of light Th.

Accordingly, the exposed photoresist material layer 220 may have more homogeneous material properties in the exposed scribe lane area SL, and the occurrence of unwanted defects may be effectively suppressed.

Previously in FIGS. 9A to 9D, the third lane 120C and the fourth lane 120D may also have a configuration similar to or identical to the first lane 120A and the second lane 120B. For example, the fifth sub-lane 125 and the sixth sub-lane 126 included in the third lane 120C may have the same patterns as the first dummy pattern LD1 and the second dummy pattern LD2, respectively. In addition, the seventh sub-lane 127 and the eighth sub-lane 128 included in the fourth lane 120D may also have the same pattern as the first dummy pattern LD1 and the second dummy pattern LD2, respectively.

In some example embodiments, the fifth dummy pattern LD5 formed in the fifth sub-lane 125 may be mirror-symmetrical to the eighth dummy pattern LD8 formed in the eighth sub-lane 128 with respect to the main area MR. In addition, the sixth dummy pattern LD5 formed in the sixth sub-lane 126 may be mirror-symmetrical to the seventh dummy pattern LD7 formed in the seventh sub-lane 127 with respect to the main area MR.

In other example embodiments, the fifth dummy pattern LD5 formed in the fifth sub-lane 125 may be the same as the eighth dummy pattern LD8 formed in the eighth sub-lane 128. In addition, the sixth dummy pattern LD6 formed in the sixth sub-lane 126 may be the same as the seventh dummy pattern LD7 formed in the seventh sub-lane 127.

Figure 10:
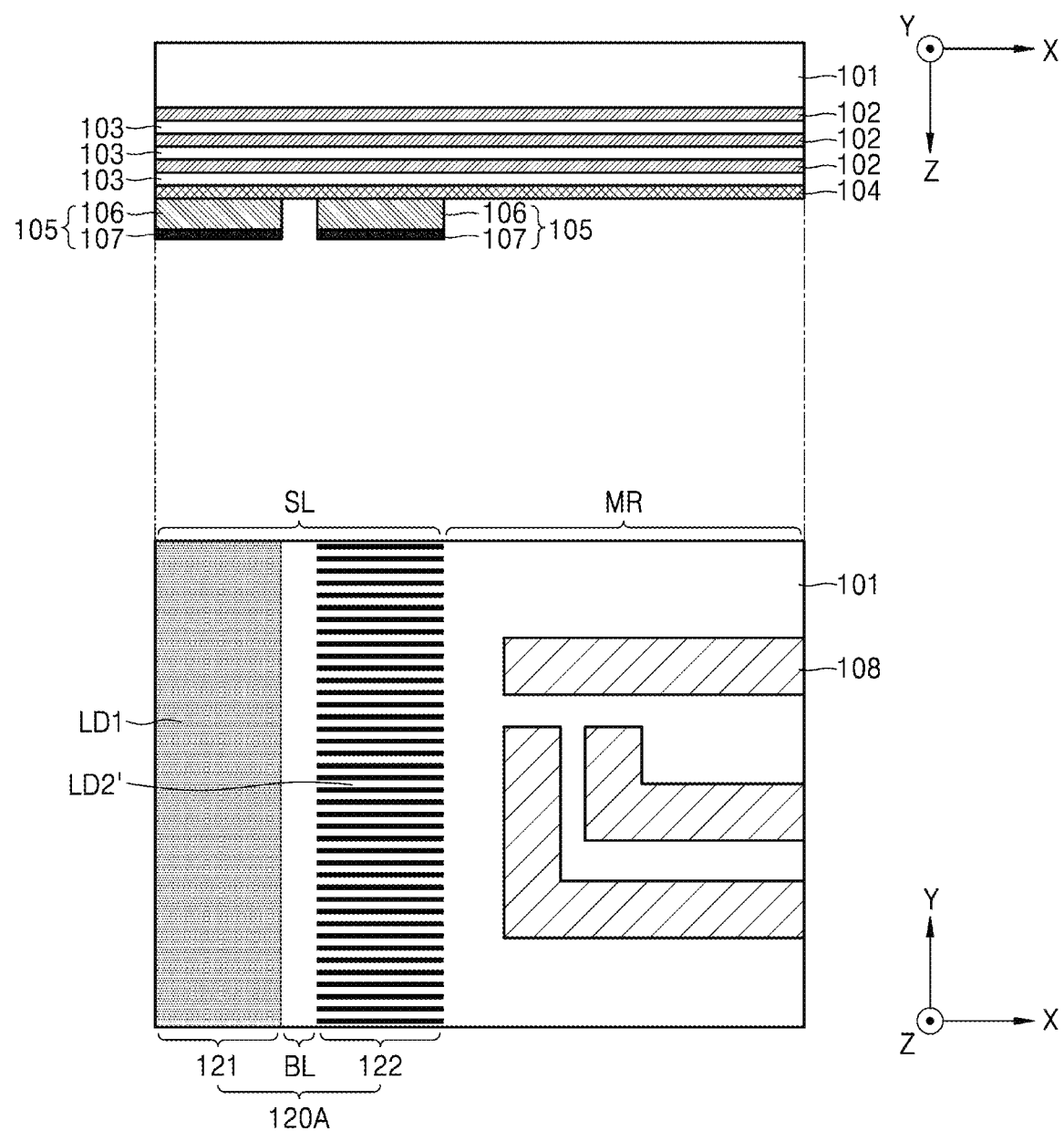
FIG. 10 is a conceptual diagram illustrating a configuration of a first lane in an EUV photomask according to example embodiments.

FIG. 10 is a conceptual diagram illustrating a configuration of a first lane in an EUV photomask according to example embodiments.

Because the example embodiments of FIG. 10 are different in the extending direction of the second dummy pattern LD2 compared to the first lane 120A according to the example embodiments of FIG. 3, this difference will be mainly described.

Referring to FIG. 10, a second dummy pattern LD2' of the second sub-lane 122 extends in the X direction toward the main area MR.

When EUV light is irradiated to the second dummy pattern LD2', because EUV light reflected by the second dummy pattern LD2' is diffracted in the Y direction, the influence of EUV light irradiated to the scribe lane area SL on the main area MR may be further reduced.

Likewise, the third sub-lane 123 of the second lane 120B may also have the same pattern as the second sub-lane 122. Further, any one of the fifth sub-lane 125 and the sixth sub-lane 126 of the third lane 120C, and any one of the seventh sub-lane 127 and the eighth sub-lane 128 of the fourth lane 120D may have a line and space pattern extending in the Y direction perpendicular to an extending direction of the second dummy pattern LD2'.

Figure 11:
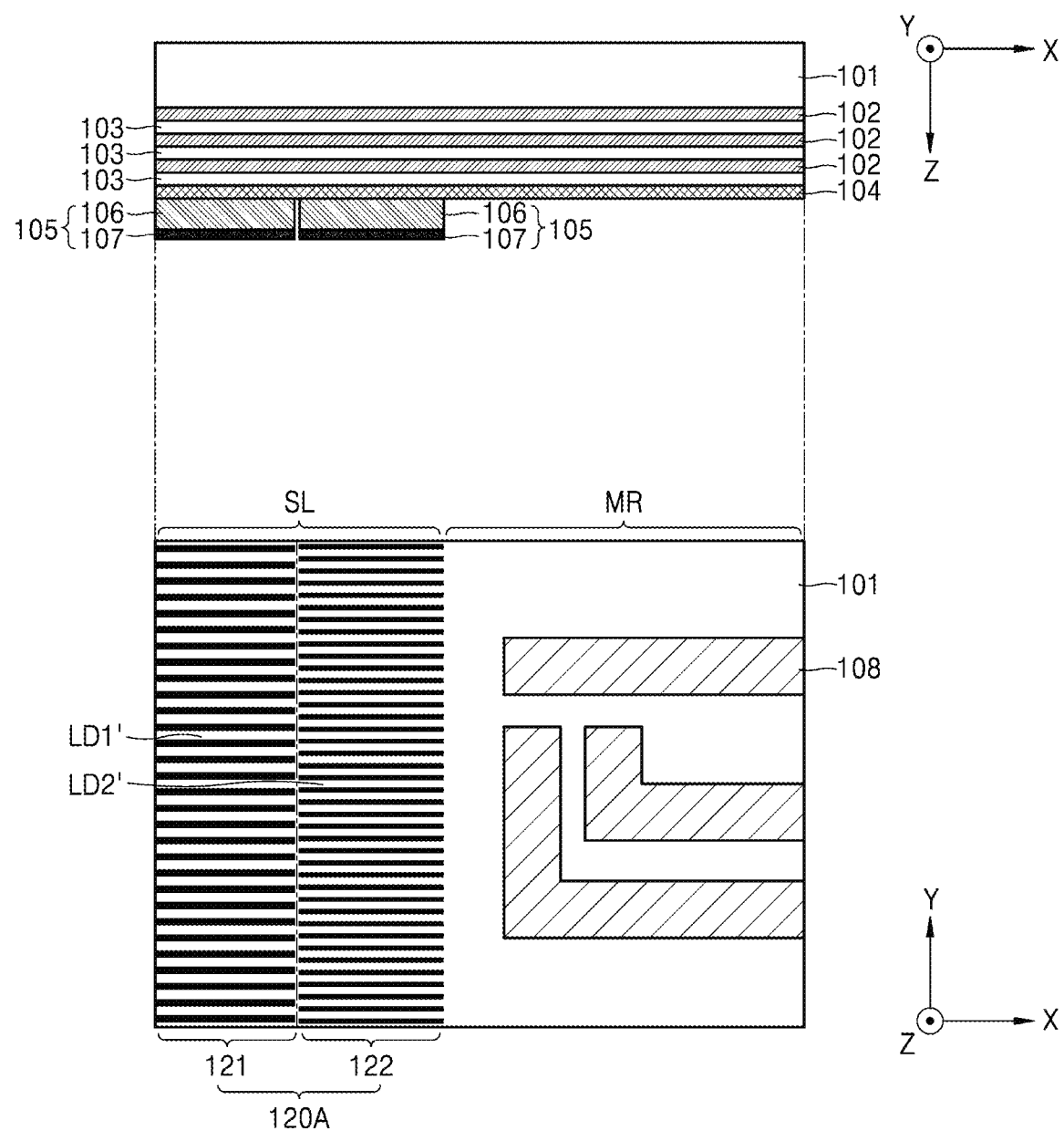
FIG. 11 is a conceptual diagram illustrating a configuration of a first lane in an EUV photomask according to other example embodiments.

FIG. 11 is a conceptual diagram illustrating a configuration of a first lane in an EUV photomask according to other example embodiments.

Because the example embodiments of FIG. 11 are different in the extending direction of each of a first dummy pattern LD1' and the second dummy pattern LD2' compared to the first lane 120A according to the example embodiments of FIG. 9A, this difference will be mainly described.

Referring to FIG. 11, both the first dummy pattern LD1' and the second dummy pattern LD2' extend in the X direction toward the main area MR.

When EUV light is irradiated to the first dummy pattern LD1' and the second dummy pattern LD2', because the EUV light reflected by the first dummy pattern LD1' and the second dummy pattern LD2' is diffracted in the Y direction, the EUV light irradiated to the scribe lane area SL on the main area MR may be further reduced.

Likewise, the fourth sub-lane 124 of the second lane 120B may also have the same pattern as the first sub-lane 121. Further, any one of the fifth sub-lane 125 and the sixth sub-lane 126 of the third lane 120C, and any one of the seventh sub-lane 127 and the eighth sub-lane 128 of the fourth lane 120D may have a line and space pattern extending in the Y direction perpendicular to the extending direction of the first dummy pattern LD1'.

Figure 12:
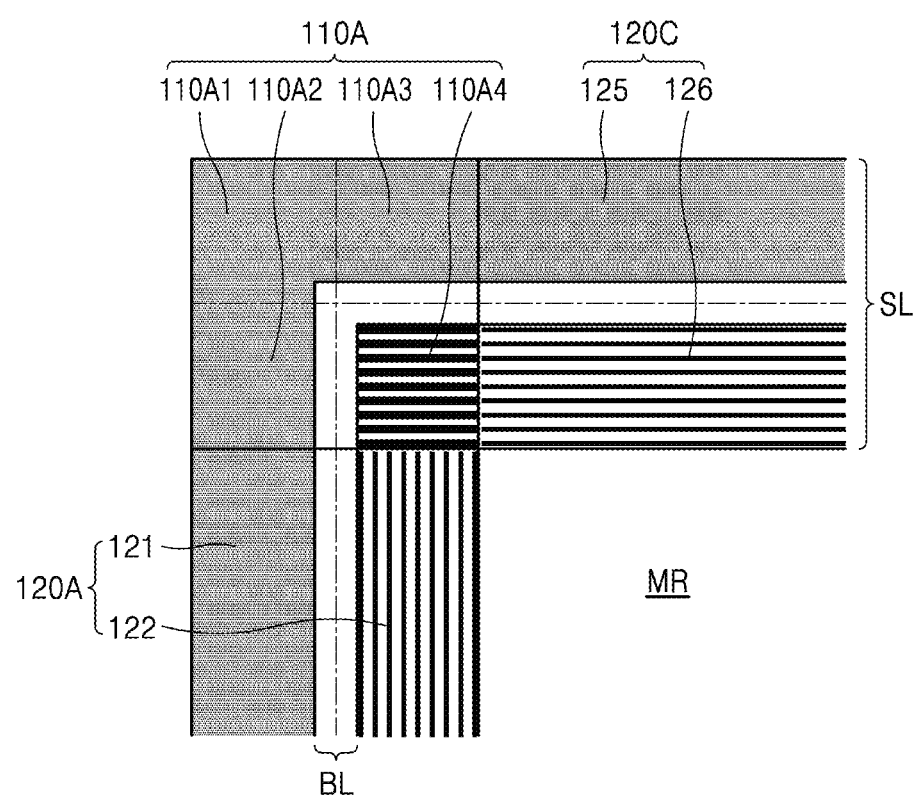
FIG. 12 is a conceptual diagram illustrating a configuration of a first corner area in an EUV photomask according to example embodiments.

FIG. 12 is a conceptual diagram illustrating a configuration of a first corner area in an EUV photomask according to example embodiments.

As previously described with reference to FIG. 2, the EUV photomask 100 according to example embodiments may include a first corner area 110A, a second corner area 110B, a third corner area 110C, and a fourth corner area 110D at each corner.

The description is made for the first corner area 110A, but one of ordinary skill in the art will understand that this description may be appropriately applied to the second corner area 110B, the third corner area 110C, and the fourth corner area 110D.

Referring to FIG. 12, the first corner area 110A may be divided into four zones and described.

The first corner area 110A may include a first zone 110A1 where an extension portion of the first sub-lane 121 intersects with an extension portion of the fifth sub-lane 125, a second zone 110A2 where the extension portion of the first sub-lane 121 intersects with an extension portion of the sixth sub-lane 126, a third zone 110A3 where an extension portion of the second sub-lane 122 intersects with the extension portion of the fifth sub-lane 125, and a fourth zone 110A4 where the extension portion of the second sub-lane 122 intersects with the extension portion of the sixth sub-lane 126.

Figure 13:
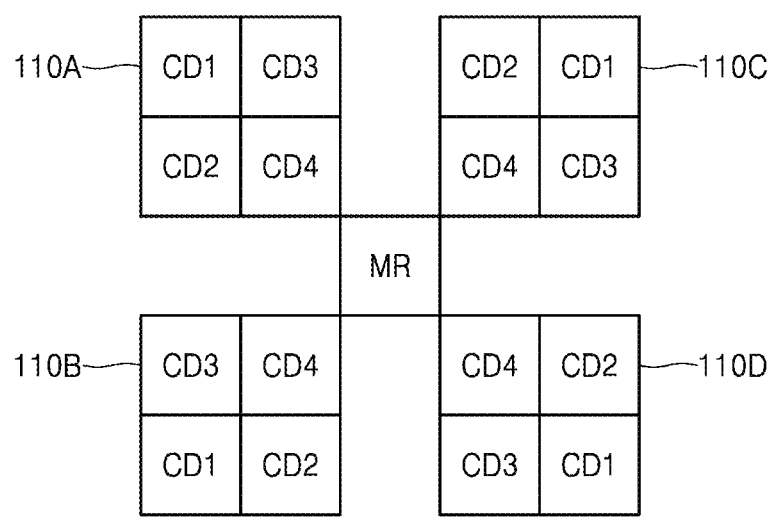
FIG. 13 is a conceptual diagram illustrating an arrangement of corner dummy patterns of each corner area in an EUV photomask according to example embodiments.

FIG. 13 is a conceptual diagram illustrating an arrangement of corner dummy patterns of each corner area in an EUV photomask according to example embodiments.

For convenience of explanation, the size of the main area MR has been exaggeratedly reduced, and the size of the first, second, third, and fourth corner areas 110A, 110B, 110C, and 110D has been exaggeratedly expanded.

Referring to FIG. 13, in each of the first, second, third, and fourth corner areas 110A, 110B, 110C, and 110D, a first corner dummy pattern CD1 and a fourth corner dummy pattern CD4 are arranged in a diagonal direction, and a second corner dummy pattern CD2 and a third corner dummy pattern CD3 may be arranged in different diagonal directions.

In some example embodiments, the fourth corner dummy pattern CD4 may be arranged closest to the main area MR, and the first corner dummy pattern CD1 may be arranged farthest from the main area MR. Also, the second corner dummy pattern CD2 and the third corner dummy pattern CD3 may be sequentially arranged in a clockwise direction around the main area MR.

Figure 14:
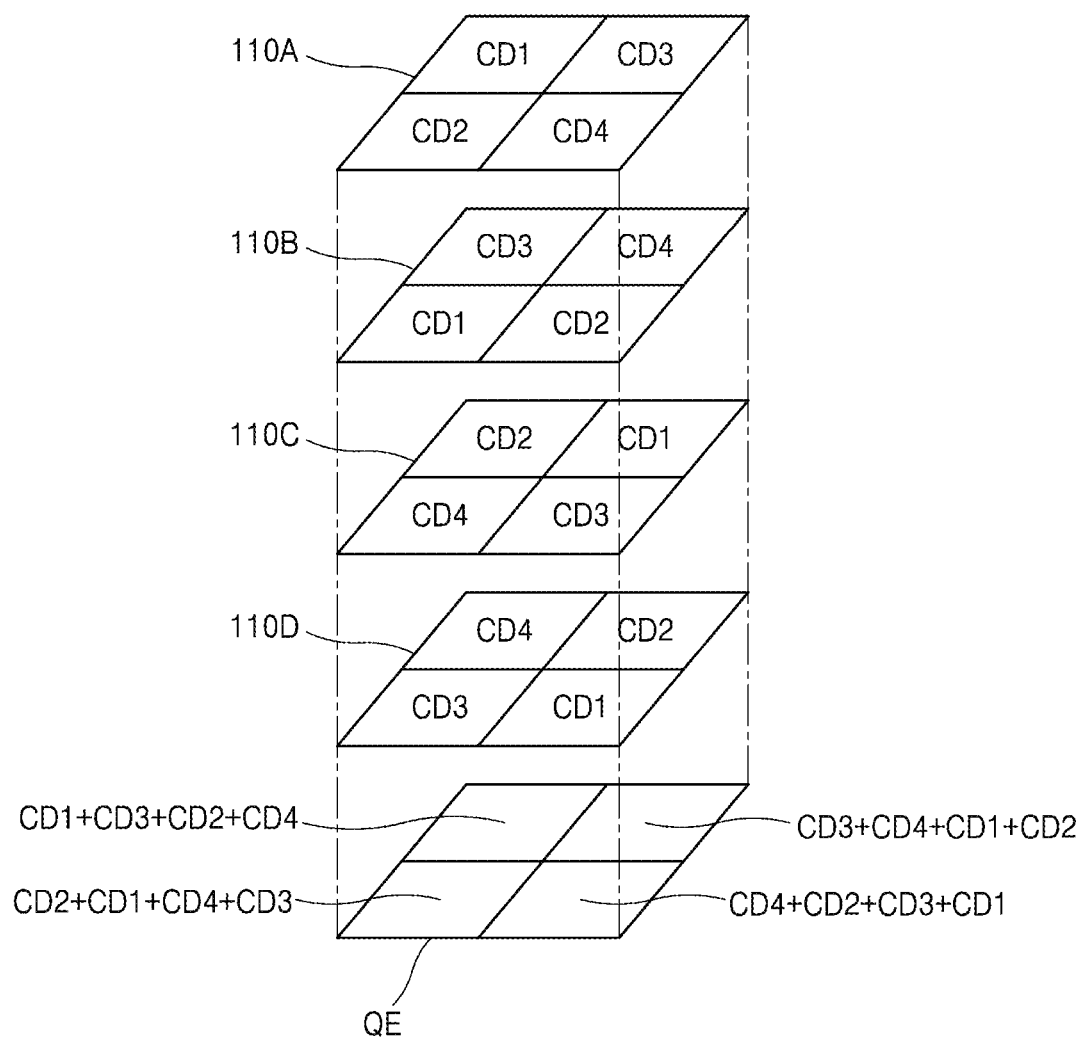
FIG. 14 is a conceptual diagram illustrating an overlapping exposure effect of each corner area in an EUV photomask according to example embodiments.

FIG. 14 is a conceptual diagram illustrating an overlapping exposure effect of each corner area in an EUV photomask according to example embodiments.

Referring to FIGS. 5 and 14, the fourth corner area 110D is exposed when shot 1 (S1) is performed on the quadruple overlap area QE, the third corner area 110C is exposed when shot 2 (S2) is performed, the second corner area 110B may be exposed when the shot 3 (S3) is performed, and the first corner area 110A may be exposed when the shot 4 (S4) is performed.

Accordingly, the first corner dummy pattern CD1 to the fourth corner dummy pattern CD4 are exposed once at positions corresponding to the first, second, third, and fourth zones 110A1, 110A2, 110A3, and 110A4 of the first corner area 110A. As a result, the amounts of light irradiated to positions corresponding to the first, second, third, and fourth zones 110A1, 110A2, 110A3, and 110A4, respectively may be the same or substantially the same as each other.

As such, after four overlapping exposures, the amount of light irradiated to a position corresponding to the quadruple overlap area QE may exceed the threshold amount of light Th of an NTD photoresist at the corresponding position. In some example embodiments, the amount of light irradiated to the quadruple overlap area QE after the four overlapping exposures may be in the range of about 105% to about 150%, about 105% to about 140%, about 105% to about 130%, or about 105% to about 125% of the threshold amount of light Th.

Referring to FIG. 12 also, the first zone 110A1, the second zone 110A2, and the third zone 110A3 may have the same dummy patterns as the dummy patterns of the first and fifth sub-lanes 121 and 125. For example, the first zone 110A1, the second zone 110A2, and the third zone 110A3 may have a block pattern, a line and space pattern, a chessboard pattern, a grid-arranged island pattern, a complementary pattern of the grid-arranged island pattern, etc., but are not limited thereto.

In addition, the fourth zone 110A4 may have the same dummy pattern as the dummy patterns of the second sub-lane 122 and the sixth sub-lane 126. For example, the fourth zone 110A4 may have a block pattern, a line and space pattern, a chessboard pattern, a grid-arranged island pattern, a complementary pattern of the grid-arranged island pattern, and the like, but is not limited thereto.

In some example embodiments, the fourth zone 110A4, the second sub-lane 122, and the sixth sub-lane 126 may have a line-and-space pattern as a dummy pattern. The line and space pattern of the fourth zone 110A4 may be different from the line and space pattern of the second sub-lane 122 and the sixth sub-lane 126. This is because the fourth zone 110A4 is an area in which four overlapping exposures are performed, but the second sub-lane 122 and the sixth sub-lane 126 are areas in which two overlapping exposures are performed, respectively. Accordingly, the light reflectivity of the fourth zone 110A4 may be lower than those of the second sub-lane 122 and the sixth sub-lane 126.

In some example embodiments, although the first sub-lane 121, the fifth sub-lane 125, the first zone 110A1, the second zone 110A2, and the third zone 110A3 are shown to have a block pattern, and the second sub-lane 122, the sixth sub-lane 126, and the fourth zone 110A4 are shown to have a line and space pattern, they may have opposite patterns.

However, the blank area BL may be between the line and space pattern and the block pattern. As a result, each of the first, second, third, and fourth corner areas 110A, 110B, 110C, and 110D may include at least partially the blank area BL at the boundary between the first to fourth zones 110A1 to 110A4.

In some example embodiments, when the first sub-lane 121, the fifth sub-lane 125, the first zone 110A1, the second zone 110A2, and the third zone 110A3 have a block pattern, the block pattern may extend along an outer edge of the entire scribe lane area SL. In addition, when the second sub-lane 122, the sixth sub-lane 126, and the fourth zone 110A4 have a line and space pattern, the line and space pattern may extend along an inner edge of the entire scribe lane area SL.

Figure 15:
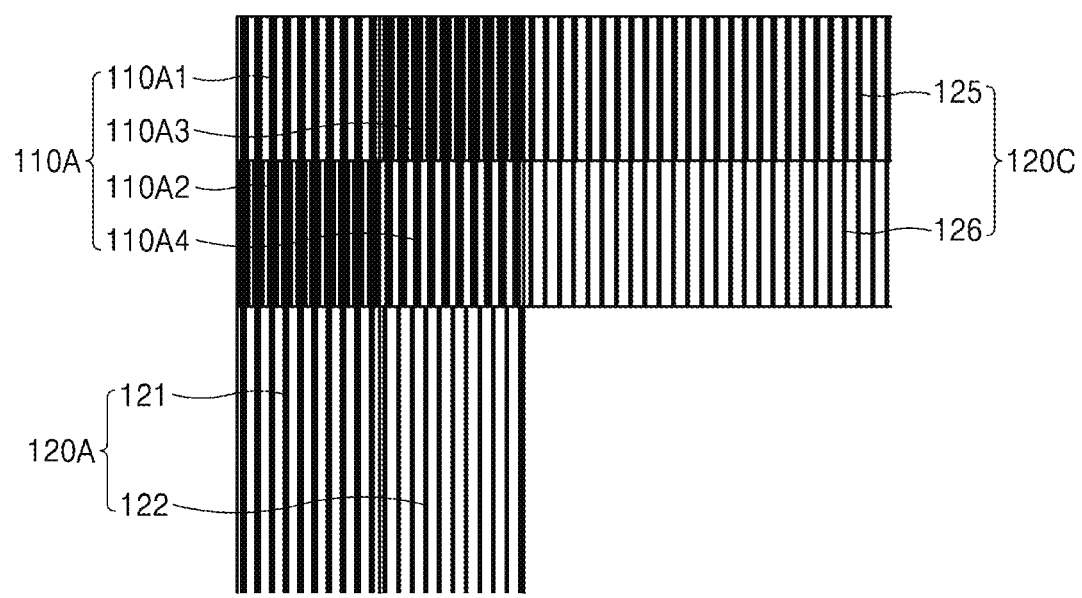
FIG. 15 is a conceptual diagram illustrating a configuration around a first corner area in an EUV photomask according to example embodiments.

FIG. 15 is a conceptual diagram illustrating a configuration around a first corner area in an EUV photomask according to example embodiments.

Referring to FIG. 15, all of the first corner area 110A, the first lane 120A, and the third lane 120C may be configured in a line and space pattern.

In some example embodiments, the first sub-lane 121 and the second sub-lane 122 of the first lane 120A may have different line and space patterns from each other. In addition, the fifth sub-lane 125 and the sixth sub-lane 126 of the third lane 120C may have different line and space patterns from each other. Further, the first sub-lane 121 may have the same line and space pattern as that of the fifth sub-lane 125. Further, the second sub-lane 122 may have the same line and space pattern as that of the sixth sub-lane 126.

In some example embodiments, all four zones arranged 2 by 2 in the first corner area 110A may have the same line and space pattern. In other example embodiments, at least one of the zones may have a different line and space pattern than the other zones so that the four areas do not all have the same light reflectivity.

In some example embodiments, line-and-space patterns may be adjusted so that two of the four zones arranged in a diagonal direction have the same or substantially the same light reflectivity. For example, the first zone 110A1 may have the same line and space pattern as that of the fourth zone 110A4. In addition, the second zone 110A2 may have the same line and space pattern as that of the third zone 110A3.

In some example embodiments, the ratio of light reflectivity in the second sub-lane 122 to the first sub-lane 121 may be the same or substantially the same as the ratio of the light reflectivity in the fourth zone 110A4 to the second zone 110A2. Also, the ratio of the light reflectivity in the sixth sub-lane 126 to the fifth sub-lane 125 may be the same or substantially the same as the ratio of the light reflectivity in the fourth zone 110A4 to the third zone 110A3. In addition, the light reflectivity in the first zone 110A1 may be adjusted so that the amount of light reflection through the first zone 110A1 and the second zone 110A2 is the same or substantially the same as the amount of light reflection through the third zone 110A3 and the fourth zone 110A4.

In other example embodiments, unlike shown, an extending direction of a line and space pattern of the first sub-lane 121 and an extending direction of a line and space pattern of the second sub-lane 122 may be configured to be perpendicular to each other. In addition, an extending direction of the line and space pattern of the fifth sub-lane 125 and an extending direction of the line and space pattern of the sixth sub-lane 126 may be configured to be perpendicular to each other.

Figure 16:
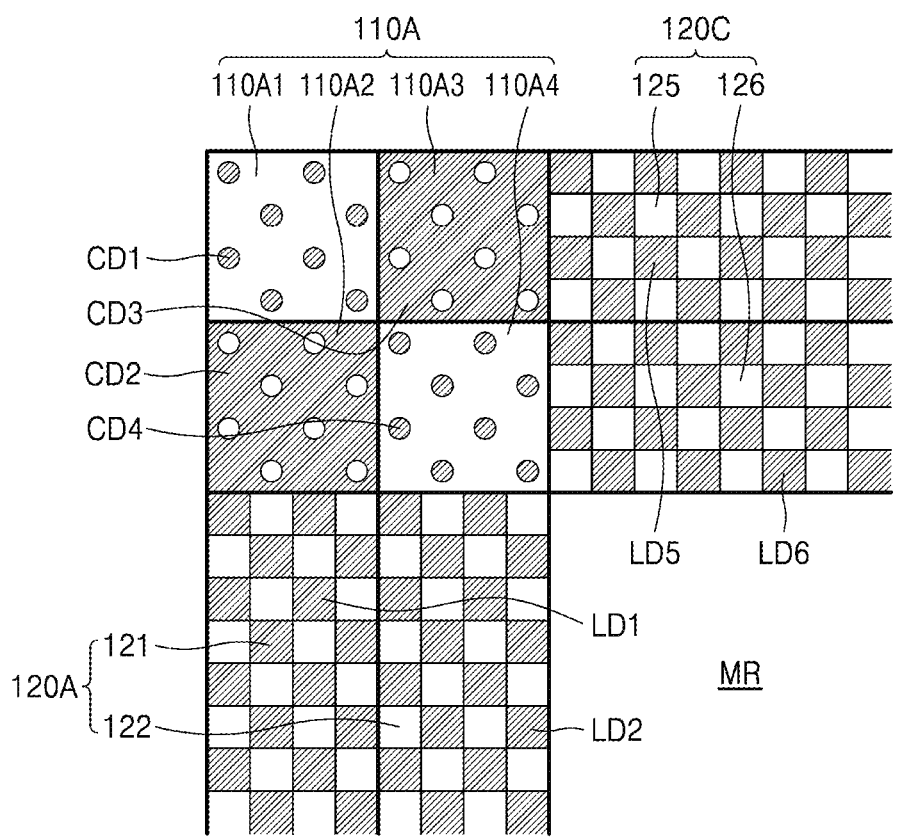
FIG. 16 is a conceptual diagram illustrating a configuration around a first corner area in an EUV photomask according to other example embodiments.

FIG. 16 is a conceptual diagram illustrating a configuration around a first corner area in an EUV photomask according to other example embodiments.

Referring to FIG. 16, each of the first corner area 110A, the first lane 120A, and the third lane 120C may have a chessboard pattern, an island pattern, or a complementary pattern of the island pattern.

In some example embodiments, the first lane 120A and the third lane 120C may have a chessboard pattern. In addition, the first corner area 110A may have an island pattern or a complementary pattern of the island pattern.

For example, the first corner dummy pattern CD1 and the fourth corner dummy pattern CD4 of the first corner area 110A may be island patterns, and the second corner dummy pattern CD2 and the third corner dummy pattern CD3 may be complementary patterns of the island patterns.

Likewise, the second corner area 110B, the third corner area 110C, and the fourth corner area 110D may be configured in the same manner as the first corner area 110A. In addition, the second lane 120B and the fourth lane 120D may be configured in the same manner as the first lane 120A and the third lane 120C.

Figure 17:
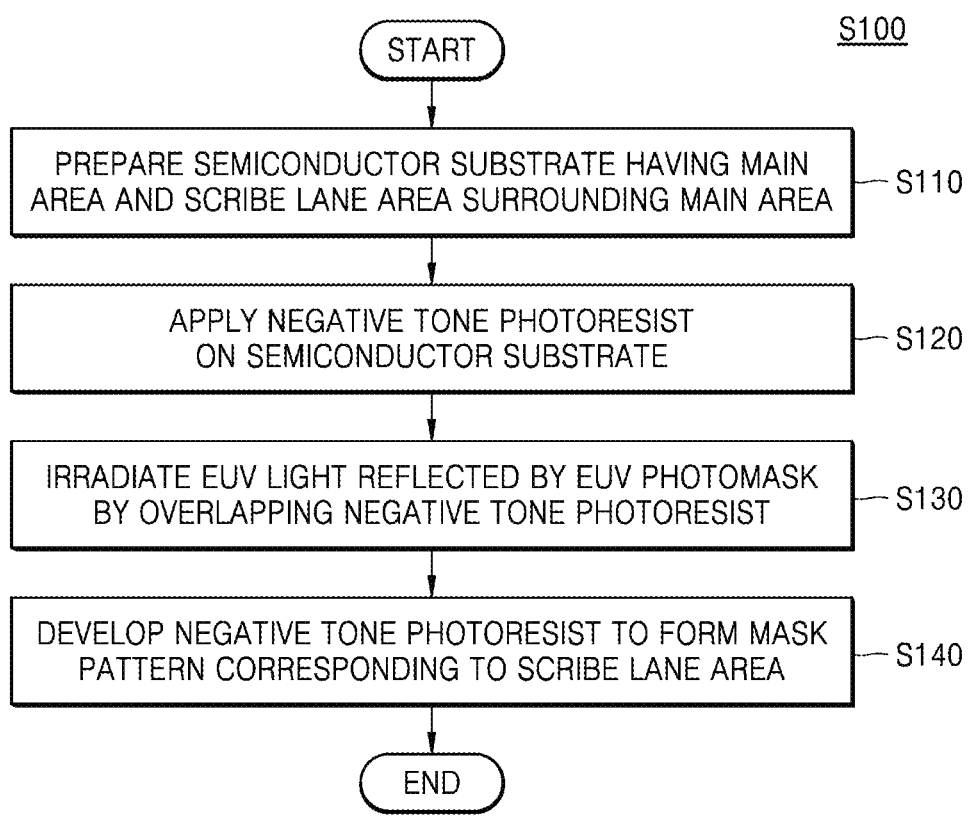
FIG. 17 is a flowchart illustrating a method of forming a mask pattern according to example embodiments.

FIG. 17 is a flowchart illustrating a method of forming a mask pattern according to example embodiments.

Referring to FIG. 17, a method S100 of forming a mask pattern may include a process sequence of first to fourth operations S110 to S140.

When certain example embodiments may be implemented differently, a specific process order may be performed differently from the described order. For example, two consecutively described processes may be performed substantially at the same time or performed in an order opposite to the described order.

The method S100 of forming a mask pattern according to the inventive concepts may include first operation S110 of preparing a semiconductor substrate having a main area and a scribe lane area surrounding the main area, second operation S120 of applying a negative tone photoresist on a semiconductor substrate, third operation S130 of irradiating EUV light reflected by an EUV photomask by overlapping the negative tone photoresist, and fourth operation S140 of developing the negative tone photoresist to form a mask pattern corresponding to the scribe lane area.

When the EUV photomask 100 (see FIG. 2) according to example embodiments is used in the method S100 of forming the mask pattern, because EUV light irradiated to the main area neighboring the scribe lane area is insignificant, it is possible to easily and simply design the pattern of the main area and apply the pattern immediately.

Ultimately, when a mask pattern is formed on a semiconductor substrate by using the EUV photomask 100 (see FIG. 2) in the method S100 of forming a mask pattern according to the inventive concepts, it is possible to reduce or prevent reflected EUV light from being unnecessarily scattered and causing an unwanted effect on a main area.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been particularly shown and described with reference to example embodiments thereof, it will be understood that various changes in form and details may be made therein without departing from the spirit and scope of the following claims.

What is claimed is:

1. An extreme ultraviolet (EUV) photomask having a main area and a scribe lane area surrounding the main area and reflecting EUV light, the EUV photomask comprising:
   a reflective multilayer film and an absorption pattern on the reflective multilayer film,
   wherein the scribe lane area includes a first lane and a second lane extending from both sides of the main area, respectively,
   wherein the first lane includes a first sub-lane and a second sub-lane extending in the same direction as an extending direction of the first lane,
   wherein the first sub-lane includes a first dummy pattern that is a portion of the absorption pattern, and
   the second sub-lane includes a second dummy pattern that is a portion of the absorption pattern, and
   when EUV light that is not absorbed by the first and second dummy patterns and is reflected by the reflective multilayer film is irradiated at least twice by overlapping a negative tone photoresist on a semiconductor substrate, an amount of light exceeds a threshold dose of light in the negative tone photoresist corresponding to the first lane.

2. The EUV photomask of claim 1, wherein the second lane includes a third sub-lane and a fourth sub-lane extending in the same direction as an extending direction of the second lane,
   the third sub-lane has a same third dummy pattern as the second dummy pattern, and
   the fourth sub-lane has a same fourth dummy pattern as the first dummy pattern.

3. The EUV photomask of claim 1, wherein the first sub-lane and the second sub-lane have the same width as each other.

4. The EUV photomask of claim 1, wherein the first lane further includes a blank area spaced apart between the first sub-lane and the second sub-lane.

5. The EUV photomask of claim 4, wherein the first dummy pattern includes a block pattern, and
   the second dummy pattern includes a line and space pattern.

6. The EUV photomask of claim 1, wherein, when EUV light not absorbed by the first and second dummy patterns and reflected by the reflective multilayer film is irradiated twice by overlapping the negative tone photoresist, the amount of light irradiated to the negative tone photoresist corresponding to the scribe lane area is about 105% to about 150% of the threshold dose of light.

7. The EUV photomask of claim 1, wherein each of the first and second dummy patterns includes a line and space pattern, and
   the line and space pattern extends in the same direction as an extending direction of the first lane.

8. The EUV photomask of claim 1, wherein each of the first and second dummy patterns includes a line and space pattern, and
   the line and space pattern extends in a direction perpendicular to an extending direction of the first lane.

9. The EUV photomask of claim 1, wherein the first and second dummy patterns have different line and space patterns from each other.

10. The EUV photomask of claim 1, wherein each of the first and second dummy patterns includes a chessboard pattern, a grid-arranged island pattern, or a complementary pattern of the grid-arranged island pattern.

11. An extreme ultraviolet (EUV) photomask having a rectangular main area and a scribe lane area surrounding the main area and reflecting EUV light, the EUV photomask comprising:
    a reflective multilayer film and an absorption pattern on the reflective multilayer film,
    wherein the scribe lane area includes first to fourth lanes extending from an edge of the main area, respectively,
    wherein the first lane includes first and second sub-lanes,
    the second lane includes third and fourth sub-lanes,
    the third lane includes fifth and sixth sub-lanes, and
    the fourth lane includes seventh and eighth sub-lanes, and
    further includes first to eighth dummy patterns corresponding to the first to eighth sub-lanes and being a portion of the absorption pattern, respectively, and
    when EUV light that is not absorbed by the first to eighth dummy patterns and is reflected by the reflective multilayer film is irradiated at least twice by overlapping a negative tone photoresist on a semiconductor substrate, an amount of light exceeds a threshold dose of light in the negative tone photoresist corresponding to the first to fourth lanes.

12. The EUV photomask of claim 11, wherein at least one of the first and second dummy patterns and at least one of the third and fourth dummy patterns include a first line and space pattern,
    at least one of the fifth and sixth dummy patterns and at least one of the seventh and eighth dummy patterns include a second line and space pattern, and
    an extending direction of the first line and space pattern is perpendicular to an extending direction of the second line and space pattern.

13. The EUV photomask of claim 11, wherein the scribe lane area further includes a corner area where the first lane meets the third lane,
    wherein the corner area comprises:
    a first zone where the first sub-lane intersects with the fifth sub-lane;
    a second zone where the first sub-lane intersects with the sixth sub-lane;
    a third zone where the second sub-lane intersects with the fifth sub-lane; and
    a fourth zone where the second sub-lane intersects with the sixth sub-lane, and
    further includes first to fourth corner dummy patterns corresponding to the first to fourth zones, respectively and being a portion of the absorption pattern, and
    when EUV light that is not absorbed by the first to fourth corner dummy patterns and is reflected by the reflective multilayer film is irradiated four times by overlapping the negative tone photoresist, the amount of light exceeds the threshold dose of light in the negative tone photoresist corresponding to the corner area.

14. The EUV photomask of claim 13, wherein the amount of light irradiated to the negative tone photoresist corresponding to the corner area is about 105% to about 150% of the threshold dose of light.

15. The EUV photomask of claim 13, wherein the corner area further comprises at least partially a blank area at a boundary of the first to fourth zones.

16. An extreme ultraviolet (EUV) photomask having a rectangular main area and a scribe lane area surrounding the main area with a certain width and reflecting EUV light, wherein the scribe lane area includes first to fourth corner areas adjacent to four corners of the main area, respectively, and when the reflected EUV light is irradiated once to a negative tone photoresist on a semiconductor substrate through the first to fourth corner areas, an amount of light exceeds a threshold dose of light in the negative tone photoresist.

17. The EUV photomask of claim 16, wherein the first to fourth corner areas are divided into four zones arranged 2 by 2, respectively, and light reflectivities of the four zones are not all the same as each other.

18. The EUV photomask of claim 17, wherein light reflectivities of two zones arranged diagonally among the four zones are substantially the same as each other.

19. The EUV photomask of claim 16, comprising:
a mask substrate;
a reflective multilayer film on the mask substrate; and
an absorption pattern on the reflective multilayer film.

20. The EUV photomask of claim 19, wherein the EUV light has a wavelength of about 4 nm to about 124 nm.

* * * * *